(12) United States Patent
Sim et al.

(10) Patent No.: US 10,462,903 B2
(45) Date of Patent: Oct. 29, 2019

(54) ELECTRONIC DEVICE AND METHOD FOR ASSEMBLING THE SAME

(71) Applicant: Samsung Electronics Co., Ltd., Gyeonggi-do (KR)

(72) Inventors: Hyun Woo Sim, Gyeonggi-do (KR); Yong Hwa Kim, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 104 days.

(21) Appl. No.: 15/233,489

(22) Filed: Aug. 10, 2016

(65) Prior Publication Data
US 2017/0048990 A1    Feb. 16, 2017

(30) Foreign Application Priority Data

Aug. 10, 2015  (KR) .................. 10-2015-0112644

(51) Int. Cl.
| | |
|---|---|
| *H05K 1/00* | (2006.01) |
| *H05K 1/14* | (2006.01) |
| *G06F 1/16* | (2006.01) |
| *H04M 1/02* | (2006.01) |

(52) U.S. Cl.
CPC .......... *H05K 1/147* (2013.01); *G06F 1/1626* (2013.01); *G06F 1/1637* (2013.01); *G06F 1/1656* (2013.01); *H04M 1/026* (2013.01); *H04M 1/0274* (2013.01); *H05K 2201/056* (2013.01); *H05K 2201/09063* (2013.01); *H05K 2201/10121* (2013.01); *H05K 2201/10128* (2013.01); *H05K 2203/0228* (2013.01)

(58) Field of Classification Search
CPC .... G06F 1/1626; G06F 1/1637; G06F 1/1656; H04M 1/026; H04M 1/0274; H05K 1/147; H05K 2201/056; H05K 2201/09063; H05K 2201/10121; H05K 2201/10128; H05K 2203/0228
See application file for complete search history.

(56) References Cited

U.S. PATENT DOCUMENTS

| | | | | |
|---|---|---|---|---|
| 6,007,886 A | * | 12/1999 | Takigami | .................. B32B 3/10 428/43 |
| 2001/0005315 A1 | * | 6/2001 | Suzuki | ................. G02B 6/0086 362/613 |
| 2008/0018390 A1 | * | 1/2008 | Lee | .......................... H01F 21/12 327/553 |
| 2009/0256759 A1 | * | 10/2009 | Hill | ......................... H01Q 1/243 343/702 |
| 2011/0188214 A1 | * | 8/2011 | Mishiro | ................. H05K 3/361 361/749 |
| 2014/0078705 A1 | * | 3/2014 | Jo | ............................ H05K 7/02 361/767 |

(Continued)

FOREIGN PATENT DOCUMENTS

| | | |
|---|---|---|
| KR | 10-2000-0062516 | 10/2000 |
| KR | 10-2011-0119133 | 11/2011 |

*Primary Examiner* — Yuriy Semenenko
(74) *Attorney, Agent, or Firm* — The Farrell Law Firm, P.C.

(57) ABSTRACT

An electronic device is provided. The electronic device includes a display substrate and a connector connected to one side of the display substrate and having a dummy pattern. A cutting part is formed in the display substrate and the connector, and the cutting part is formed adjacent to the dummy pattern.

19 Claims, 23 Drawing Sheets

(56) References Cited

U.S. PATENT DOCUMENTS

| | | | | |
|---|---|---|---|---|
| 2015/0036300 A1* | 2/2015 | Park | ..................... | H05K 1/147 361/749 |
| 2015/0324024 A1* | 11/2015 | Hwang | ................. | G06F 3/041 345/173 |
| 2017/0170255 A1* | 6/2017 | Ha | ..................... | G06F 1/1652 |

* cited by examiner

ELECTRONIC DEVICE AND METHOD FOR ASSEMBLING THE SAME

PRIORITY

This application claims priority under 35 U.S.C. § 119(a) to a Korean Patent Application filed on Aug. 10, 2015, in the Korean Intellectual Property Office and assigned Serial No. 10-2015-0112644, the entire disclosure of which is incorporated herein by reference.

BACKGROUND

1. Field of the Disclosure

The present disclosure relates generally to an electronic device including a display, and a method for assembling the same.

2. Description of the Related Art

An electronic device, such as a smartphone, a tablet PC, a digital camera, a laptop computer, or a PDA, may include a display that provides various contents such as images, texts, and videos to a user. The display may be installed within a housing of the electronic device. The display may include a display substrate and components (for example, a camera, a receiver, various sensors, and buttons) installed at a periphery of the display substrate.

The size of the housing of the electronic device may become larger because the width of the bezel of the electronic device increases as various components are installed between a periphery of the display substrate and an inner surface of the housing, that is, a bezel area corresponding to a periphery of a display area of the electronic device.

SUMMARY

The present disclosure has been made to address at least the above-mentioned problems and/or disadvantages and to provide at least the advantages described below.

Accordingly, an aspect of the present disclosure is to provide an electronic device that prevents the width of a bezel of the electronic device from increasing in size or decreases the width of the bezel.

In accordance with an aspect of the present disclosure, an electronic device is provided. The electronic device includes a display substrate; and a connector connected to one side of the display substrate and having a dummy pattern. A cutting part is formed in the display substrate and the connector, and the cutting part is formed adjacent to the dummy pattern.

In accordance with another aspect of the present disclosure, an electronic device is provided. The electronic device includes a display substrate and a connector connected to one side of the display substrate and having a dummy pattern. A plurality of via holes are formed adjacent to the dummy pattern, and a cutting part is formed in the display substrate and the connector, and a cut surface of the cutting part is formed to cross at least a portion of the plurality of via holes.

In accordance with another aspect of the present disclosure, an electronic device is provided. The electronic device includes a housing including a first plate facing a first direction and a second plate facing a second direction opposite to the first direction, a display disposed within the housing and exposed through the first plate, and a component disposed adjacent to the display, when viewed from the top of the first plate. The display includes a display substrate and a connector. The display includes a first surface disposed in parallel to the first plate and facing the first direction, a second surface facing the second direction, and a third surface facing a third direction that is substantially perpendicular to the first surface. The connector includes a first part disposed on the first surface, a second part disposed on the second surface, and a third part extending from the first part to the second part and covering at least a portion of the third surface. A peripheral portion of the display substrate includes a recess. Portions of the first part, the second part, and the third part of the connector are cut along the recess of the display substrate, when viewed from above the first plate, The wherein the connector further includes a first non-conductive layer facing the first direction, a second non-conductive layer facing the second direction, and a metal pad or pattern disposed along at least a portion of a periphery of the recess and inserted between the first non-conductive layer and the second non-conductive layer, in which the metal pad or pattern is electrically isolated. At least a portion of the component is disposed in the recess, when viewed from above the first plate.

BRIEF DESCRIPTION OF THE DRAWINGS

The above and other aspects, features, and advantages of the present disclosure will be more apparent from the following description taken in conjunction with the accompanying drawings, in which.

DETAILED DESCRIPTION OF EMBODIMENTS OF THE PRESENT DISCLOSURE

Figure 1:
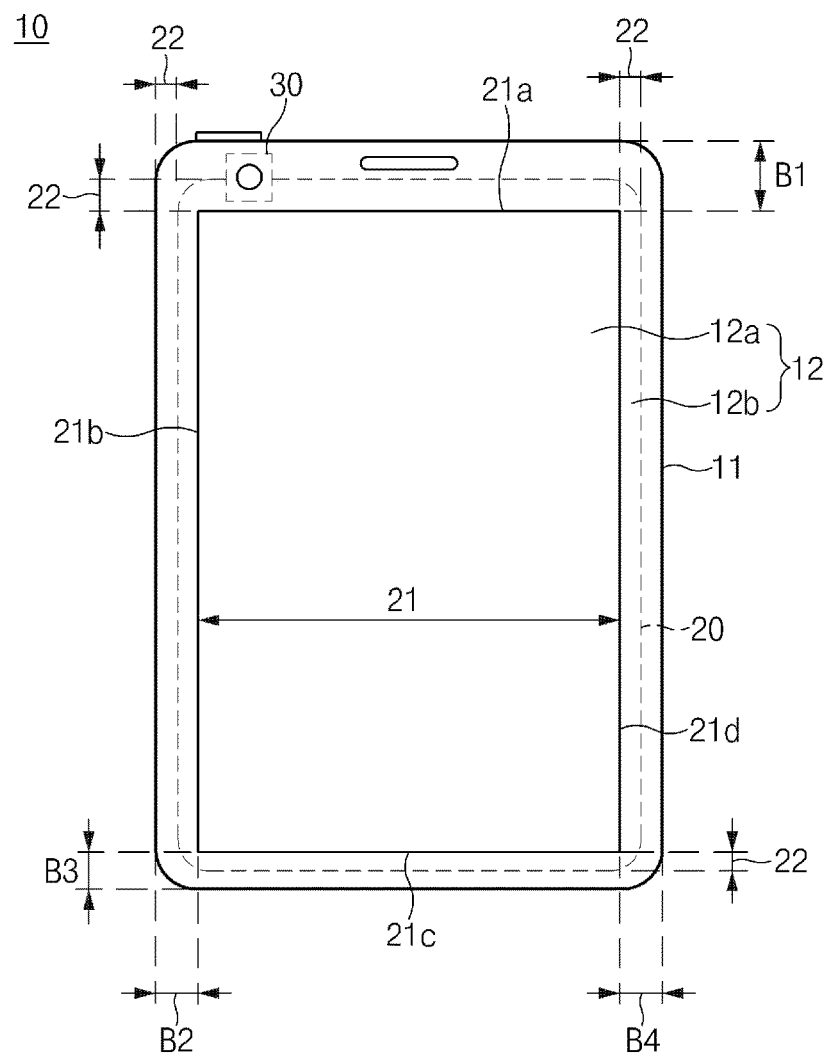
FIG. 1 is a plan view of an electronic device, according to an embodiment of the present disclosure.

Hereinafter, various embodiments of the present disclosure are disclosed with reference to the accompanying drawings. However, the present disclosure is not limited by the various embodiments disclosed herein and is, instead, intended to cover all modifications, equivalents, and/or alternatives of the present disclosure provided they come within the scope of the appended claims and their equivalents. With respect to the descriptions of the accompanying drawings, like reference numerals refer to like elements.

The terms and words used in the following description and claims are not limited to their dictionary meanings, but are used to enable a clear and consistent understanding of the present disclosure. Accordingly, it should be apparent to those skilled in the art that the following description of various embodiments of the present disclosure is provided for illustration purposes only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms "include," "comprise," and "have" used herein indicate disclosed functions, operations, or the existence of elements, but do not exclude other functions, operations or elements.

For example, the expressions "A or B," and "at least one of A and/or B" may indicate A, B, or both A and B. Terms such as "1st," "2nd," "first," "second," and the like, used herein may refer to modifying various elements of various embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (for example, a first component) is referred to as being "operatively or communicatively "coupled"" or "connected" with/to" another component (for example, a second component), the first component may be directly connected to the second component or connected through another component (for example, a third component). Conversely, it is intended that when a component (for example, a first component) is referred to as being "directly "connected to" or "directly accessed by" another component (for example, a second component), another component (for example, a third component) does not exist between the first component and the second component.

The expression "configured to", used in various embodiments of the present disclosure, may be used interchangeably with "suitable for," "having the capacity to," "designed to," "adapted to," "made to," or "capable of", according to the situation. The term "configured to" may not necessarily indicate "specifically designed to" in terms of hardware. Instead, the expression "a device configured to", in some situations, may indicate that the device and another device or part thereof are "capable of." For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used herein are to describe certain embodiments of the present disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning in the related art, and unless clearly defined herein, should not be understood differently or as having an excessively formal meaning. In addition, the terms defined in the present specification are not intended to be interpreted as excluding embodiments of the present disclosure.

An electronic device, according to various embodiments of the present disclosure, may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) audio layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit).

In various embodiments of the present disclosure, an electronic device may be a smart home appliance. The smart home appliance may include at least one of a television (TV), a digital video/versatile disc (DVD) player, an audio device, a refrigerator, an air conditioner, a cleaner, an oven, a microwave oven, a washing machine, an air cleaner, a to set-top box, a home automation control panel, a security control panel, a television (TV) box (e.g., Samsung HomeSync™, Apple TV™, or Google TV™), a game console (e.g., Xbox™ or PlayStation™), an electronic dictionary, an electronic key, a camcorder, or an electronic picture frame.

In various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, etc.), a magnetic resonance angiography (MRA) device, a magnetic resonance imaging (MRI) device, a computed tomography (CT) device, a scanner, an ultrasonic device, etc.), a navigation device, a global navigation satellite system (GNSS), an event data recorder (EDR), a flight data recorder (FDR), a vehicle infotainment device, electronic equipment for vessels (e.g., a navigation system, a gyrocompass, etc.), avionics, a security device, a head unit for a vehicle, an industrial or home robot, an automatic teller machine (ATM), a point of sales (POS) device of a store, or an Internet of Things (IoT) device (e.g., a light bulb, various sensors, an electric or gas meter, a sprinlder, a fire alarm, a thermostat, a streetlamp, a toaster, exercise equipment, a hot water tank, a heater, a boiler, etc.).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, etc.).

An electronic device may be one or more combinations of the above-mentioned devices.

An electronic device, according to some various embodiments of the present disclosure, may be a flexible device.

An electronic device, according to an embodiment of the present disclosure, is not limited to the above-mentioned devices, and may include new electronic devices with the development of new technology.

Hereinafter, an electronic device, according to various embodiments of the present disclosure, will be described in more detail with reference to the accompanying drawings. The term "user" used herein may refer to a person who uses an electronic device or may refer to a device (e.g., an artificial intelligence electronic device) that uses an electronic device.

FIG. 1 is a plan view of an electronic device, according to an embodiment of the present disclosure.

Referring to FIG. 1, an electronic device 10, according to various embodiments of the present disclosure, is provided. The electronic device 10 includes a housing 11, a display installed within the housing 11, and one or more components installed adjacent to a periphery of the display. The housing 11 may have a first surface that faces a first direction (the front side), and a second surface that faces a second direction, opposite to the first direction.

The display includes a display substrate 20, and the display substrate 20 includes a first surface (front surface) on which contents (for example, images, texts, and videos) are displayed and a second surface (rear surface) situated on a side opposite to the first surface. The first surface (front surface) of the display substrate 20 may be classified into a screen area 21 for display and a peripheral area 22 that surrounds the screen area 21. The peripheral area 22 may be formed by a black matrix.

The screen area 21 of the display substrate 20 has a first side 21a having a first length, a second side 21b that extends from one end of the first side 21a in a direction perpendicular to the first side 21a, a third side 21c that extends from one end of the second side 21b in a direction perpendicular to the second side 21b, and a fourth side 21d that extends from one end of the third side 21c in a direction perpendicular to the third side 21c. The second side 21b has a second length longer than the first length, the fourth side 21d has the same second length as that of the second side 21b, and the third side 21c has the same first length as that of the first side 21a. A curved surface may be formed in the vicinity of the second side 21b and/or the fourth side 21d. The display substrate 20 may include various panels, such as a liquid crystal display (LCD) panel, a light-emitting diode (LED) panel, and an organic light-emitting diode (OLED) panel, which have an upper plate and a lower plate.

A window 12, that is a first plate that covers the display substrate 20, is mounted on a first surface of the housing 11, and the window 12 exposes contents to the outside while protecting the first surface of the display substrate 20.

A second plate (a rear plate) is provided on the second surface of the housing 11, and the second plate may be integrally formed on the second surface of the housing 11 or may be separately manufactured to be mounted on the second surface of the housing 11.

The window 12 has a display area 12a that exposes contents of the display substrate 20, and a non-display area 12b that interrupts visibility from the outside. The display area 12a of the window 12 may cover the screen area 21 of the display substrate 20, and the non-display area 12b of the window 12 may cover the peripheral area 22 of the display substrate 20.

In the electronic device 10, a plurality of bezels B1, B2, B3, and B4 may be formed at a periphery of the electronic device 10 as the peripheral area 22 of the display substrate 20 is covered by the non-display area 12b of the window 12. The plurality of bezels B1, B2, B3, and B4 includes a first bezel B1 arranged at an upper periphery of the display substrate 20, a second bezel B2 arranged at a left periphery of the display substrate 20, a third bezel B3 arranged at a lower periphery of the display substrate 20, and a fourth bezel B4 arranged at a right periphery of the display substrate 20. The first bezel B1 may be situated at the first side 21a of the screen area 21, the second bezel B2 may be situated at a second side 21b of the screen area 21, the third bezel B3 may be situated at a third side 21c of the screen area 21, and the fourth bezel B4 may be situated at a fourth side 21d of the screen area 21.

The widths of the plurality of bezels B1, B2, B3, and B4 may be the same or similar, or may be different according to the specification of the product. In particular, the width of the bezel in which the component 30 is installed may be the widest of the plurality of bezels B1, B2, B3, and B4. For example, in the case of a mobile device, a component 30, such as a camera, a receiver, a sensor, or a button, which performs various is functions, may be installed on the upper side of the electronic device 10 on the first bezel B1, for convenience of use, and the width of the first bezel B1 in which the component 30 is installed may be formed widest.

Although FIG. 1 illustrates a component 30, such as a camera, a sensor, a receiver, or a button, installed in an upper periphery of the display substrate 20, that is, in the first bezel B1, the component 30 may be installed in the second bezel B2, the third bezel B3, and the fourth bezel B4.

Figure 2:
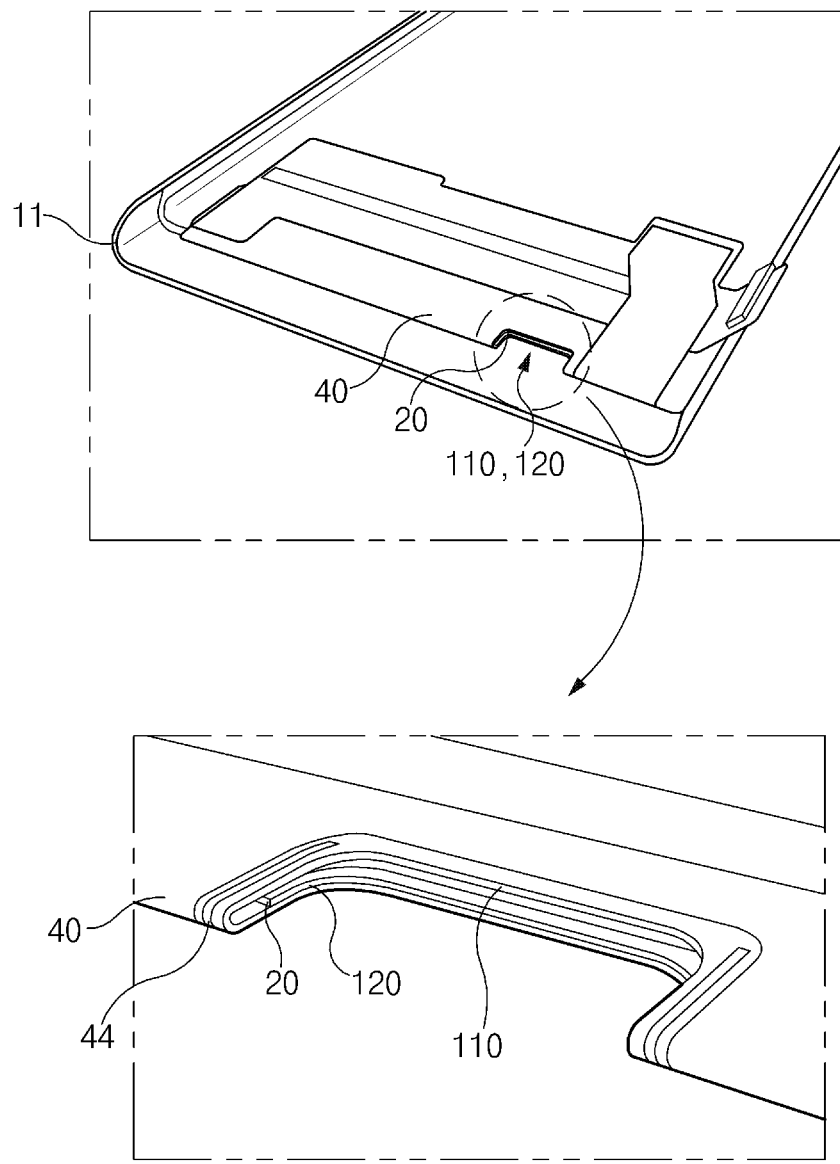
FIG. 2 illustrates an electronic device and a partially cutaway perspective view of the electronic device, according to an embodiment of the present disclosure.
Figure 3:
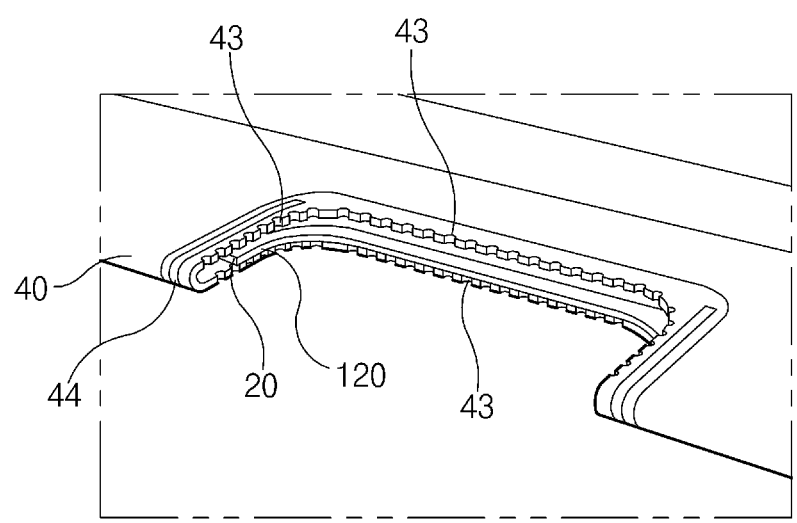
FIG. 3 is a perspective view illustrating a modified embodiment of FIG. 2, according to an embodiment of the present disclosure.

FIG. 2 illustrates an electronic device and a partially cutaway perspective view of the electronic device, according to an embodiment of the present disclosure. FIG. 3 is a perspective view illustrating a modified embodiment of FIG.

Figure 4:
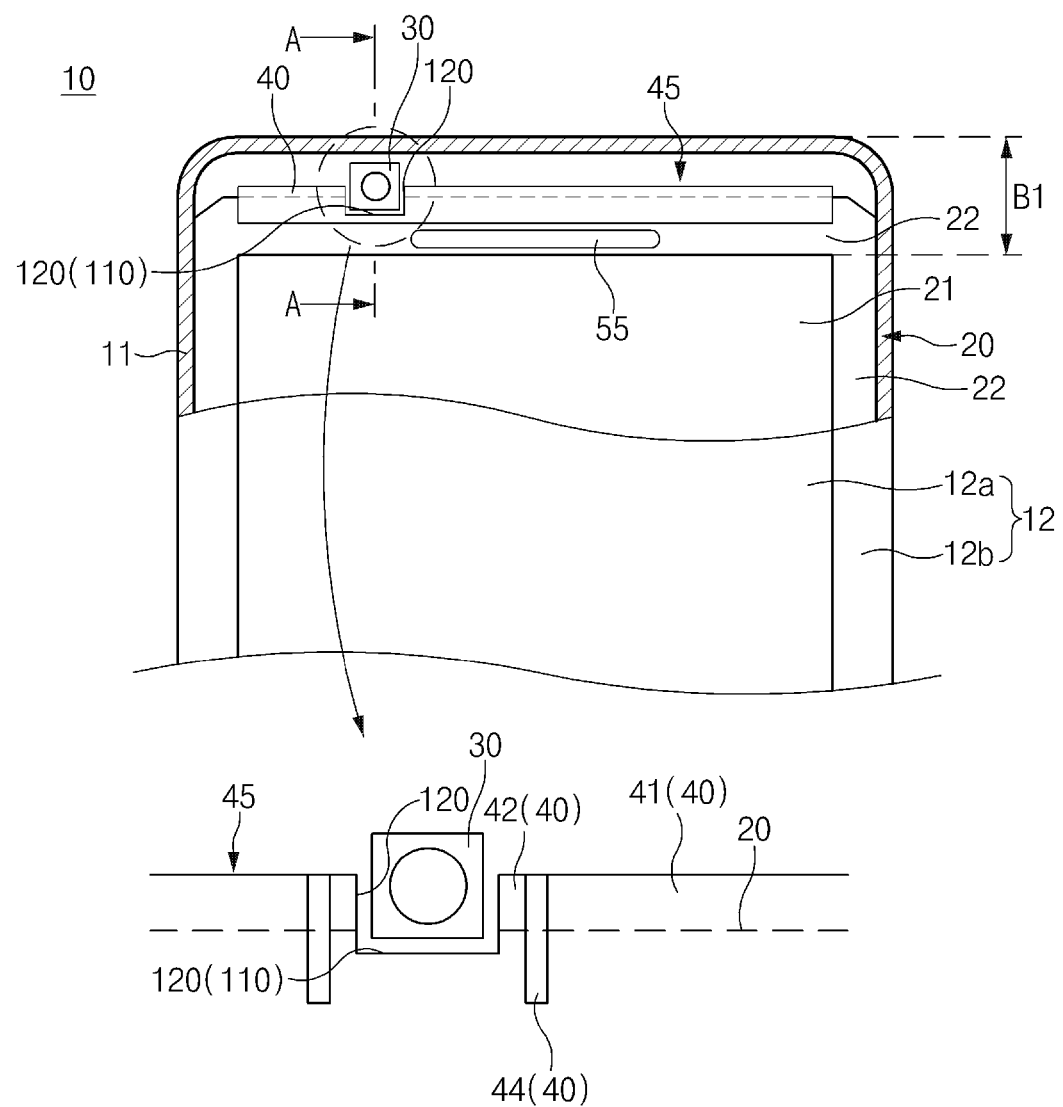
FIG. 4 is a partially cutaway plan view of an electronic device, according to an embodiment of the present disclosure.
Figure 5:
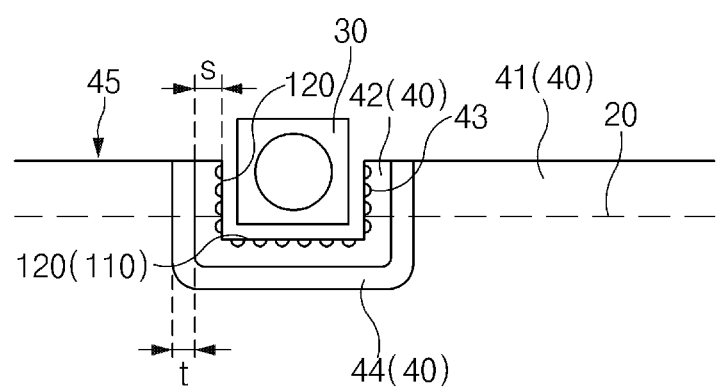
FIG. 5 is a view illustrating a modified embodiment of FIG. 4, according to an embodiment of the present disclosure.

2, according to an embodiment of the present disclosure. FIG. 4 is a partially cutaway plan view of an electronic device, according to an embodiment of the present disclosure. FIG. 5 is a view illustrating a modified embodiment of FIG. 4, according to an embodiment of the present disclosure.

Referring to FIGS. 2 to 5, the electronic device 10 having a connector is shown. The connector may be a flexible printed circuit board (FPCB) 40 that transmits a driving signal of the display substrate 20 and may be connected to an electrode pattern formed in the peripheral area 22 on one side of the display substrate 20. The display substrate 20 is electrically connected to a main board through the flexible printed circuit board 40, and the display substrate 20 may be formed with a plate of a glass or plastic material.

As illustrated in FIG. 4, a driver IC 55 may be mounted on one side of the display substrate 20, and according to another configuration, the driver IC 55 may be mounted on one side of the flexible printed circuit board 40 that is a connector.

Figure 6:
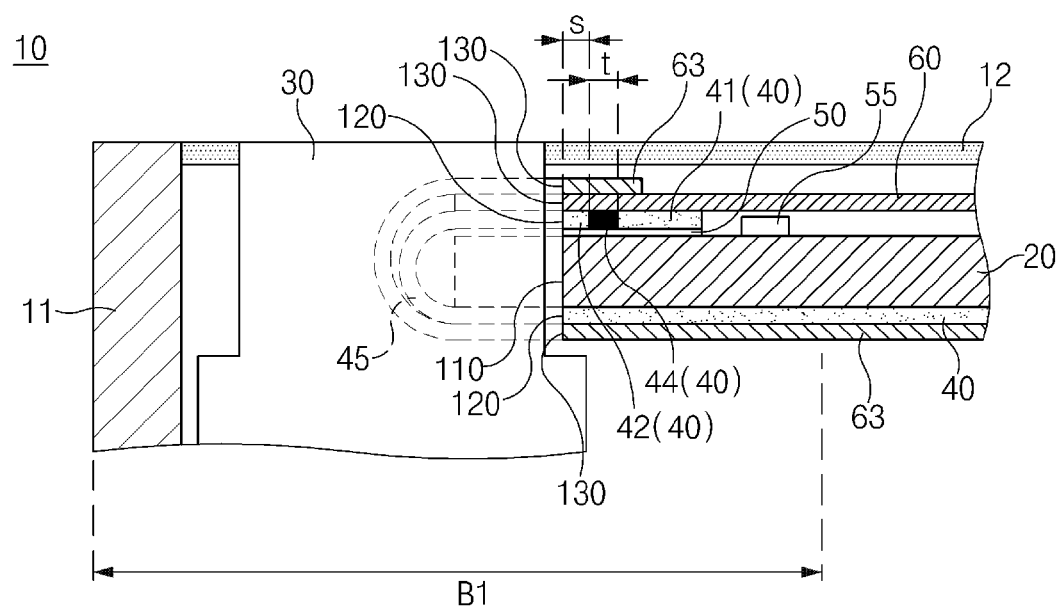
FIG. 6 is a sectional view taken along line A-A of FIG. 4, according to an embodiment of the present disclosure.

FIG. 6 is a sectional view taken along line A-A of FIG. 4, according to an embodiment of the present disclosure.

Referring to FIG. 6 a sectional view taken along line A-A of FIG. 4 is shown. A periphery of one side of the flexible printed circuit board 40 may be bonded to a peripheral area 22 of one side of the display substrate 20 by a conductive bonding layer 50, and accordingly, the flexible printed circuit board 40 may be electrically connected to the driver IC 55 of the display substrate 20.

Figure 7:
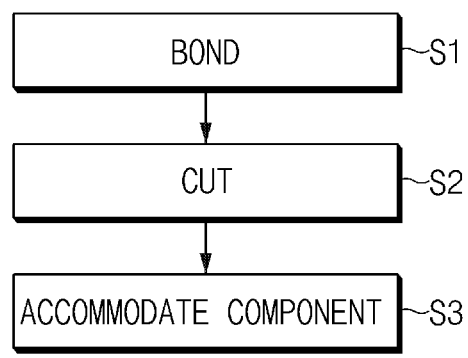
FIG. 7 is flowchart of a method for assembling an electronic device, according to an embodiment of the present disclosure.
Figure 8:
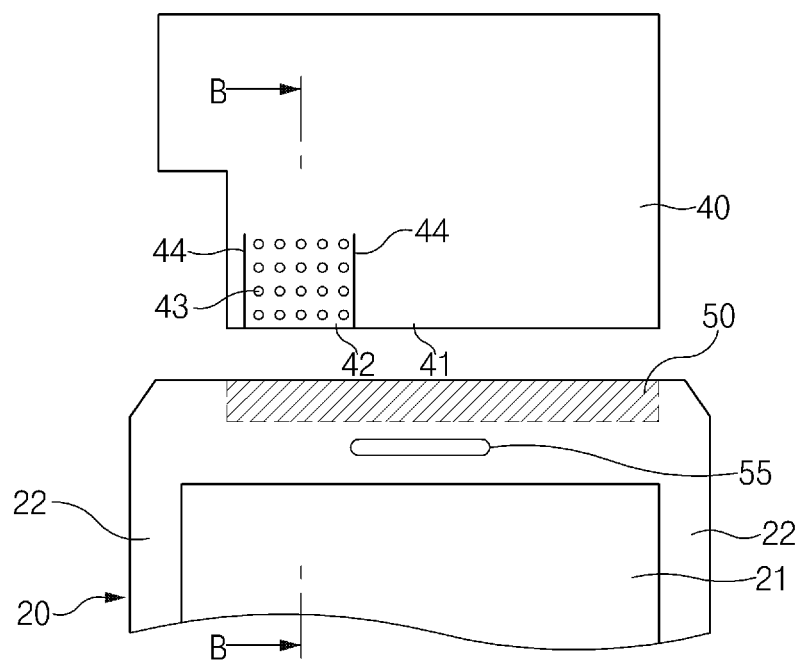
FIG. 8 is a plan view illustrating a state before a display substrate and a flexible printed circuit board (FPCB) of an electronic device are bonded to each other, according to an embodiment of the present disclosure.
Figure 9:
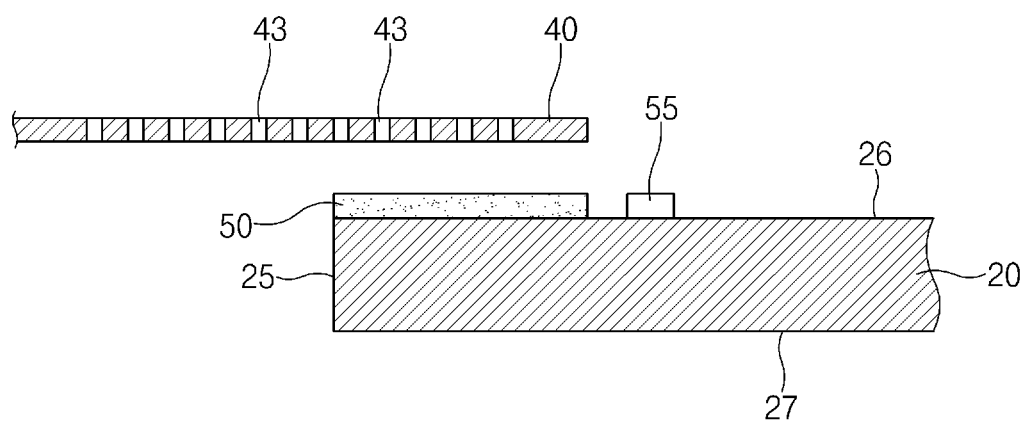
FIG. 9 is a sectional view taken along line B-B of FIG. 8, according to an embodiment of the present disclosure.
Figure 10:
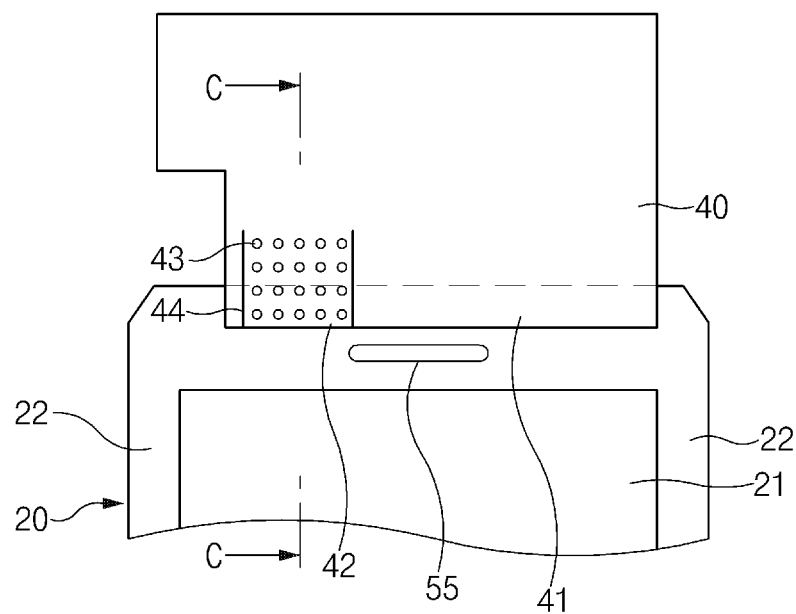
FIG. 10 is a plan view illustrating a state in which a display substrate and an FPCB of an electronic device are bonded to each other, according to an embodiment of the present disclosure.
Figure 11:
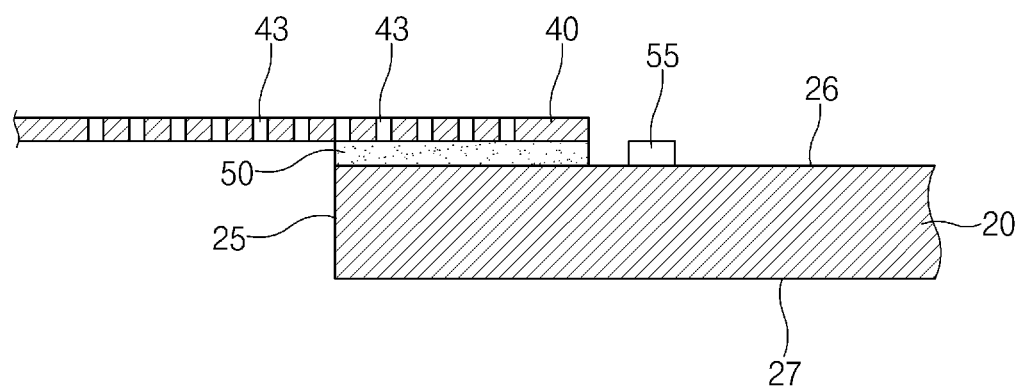
FIG. 11 is a sectional view taken along line C-C of FIG. 10, according to an embodiment of the present disclosure.
Figure 12:
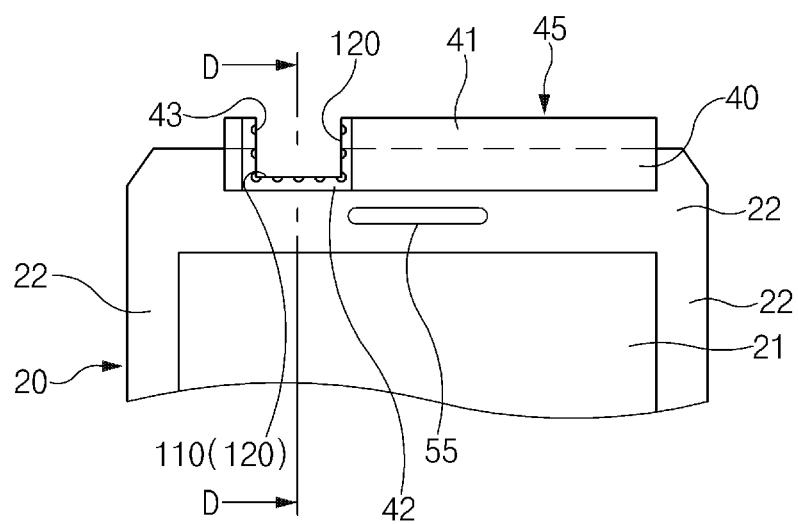
FIG. 12 is a plan view illustrating first and second cutting parts formed at a portion at which a display substrate and a FPCB of an electronic device are bonded to each other, according to an embodiment of the present disclosure.
Figure 13:
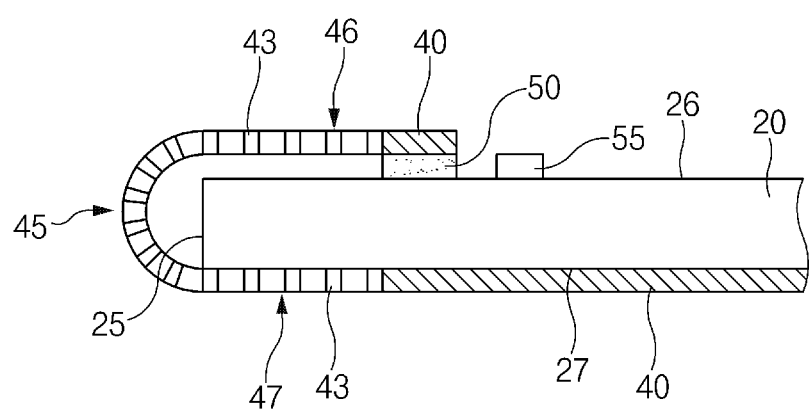
FIG. 13 is a sectional view taken along line D-D of FIG. 12, according to an embodiment of the present disclosure.

FIG. 7 is a flowchart of a method for assembling an electronic device, according to an embodiment of the present disclosure. FIG. 8 is a plan view illustrating a state before a display substrate and a flexible printed circuit board (FPCB) of an electronic device are bonded to each other, according to an embodiment of the present disclosure. FIG. 9 is a sectional view taken along line B-B of FIG. 8, according to an embodiment of the present disclosure. FIG. 10 is a plan view illustrating a state in which a display substrate and an FPCB of an electronic device are bonded to each other, according to an embodiment of the present disclosure. FIG. 11 is a sectional view taken along line C-C of FIG. 10, according to an embodiment of the present disclosure. FIG. 12 is a plan view illustrating first and second cutting parts formed at a portion at which a display substrate and a FPCB of an electronic device are bonded to each other, according to an embodiment of the present disclosure. FIG. 13 is a sectional view taken along line D-D of FIG. 12, according to an embodiment of the present disclosure.

Referring to FIGS. 9, 11, and 13, the display substrate 20 has a first surface 26 that is parallel to a first plate 12 (a window) of the housing 11, a second surface 27 that is parallel to a second plate of the housing 11, and a third surface 25 that is disposed to be substantially perpendicular to the first surface 26. The first surface 26 may face the first direction of the housing 11, the second surface 27 may face the second direction of the housing 11, and the third surface may face the third direction perpendicular to the first to direction of the housing 11.

As shown in FIG. 13, the flexible printed circuit board 40 has a first part 46 disposed on the first surface 26 of the display substrate 20, a second part 47 disposed on the second surface 27 of the display substrate 20, and a third part 45 that extends from the first part 46 to the second part 47. The third part 45 may be formed to cover a portion of the third surface 25 of the display substrate 20.

Referring to FIG. 7, in step S1, the first part 46 of the flexible printed circuit board 40 may be bonded to a periphery of the first surface 26 of the display substrate 20.

According to an embodiment, the bonding layer 50 may be an anisotropic conductive film (ACF). Because the bonding layer 50 is pressed after being interposed between an electrode pattern provided at a periphery of one side of the flexible printed circuit board 40 and an electrode pattern provided at a periphery of one side of the display substrate 20, the flexible printed circuit board 40 and the display substrate 20 may be physically bonded and electrically connected to each other very firmly.

As shown in FIG. 12, a recess for accommodating the component 30 may be formed at a portion at which the display substrate 20 and the flexible printed circuit board 40 are bonded to each other by the bonding layer 50.

Referring to FIG. 7, in step S2, the recess may be formed by cutting a first cutting part 110 of the display substrate 20 and a second cutting part 120 of the flexible printed circuit board 40 at the same time. The first and second cutting parts 110 and 120 may be cut by a pinnacle die having an embossed cutting blade, or may be cut through a pulse-width modulation (PWM) control method of a laser. The first cutting part 110 may be formed in the peripheral area 22 corresponding to a periphery of one side of the display substrate 20. The second cutting part 120 may be formed at a periphery of one side of the flexible printed circuit board 40 that is bonded to the display substrate 20.

The size and shape of the first cutting part 110 and the second cutting part 120 may correspond to each other partially or entirely according to the shape or size of the component 30. For example, when the size of the component 30 is relatively large, as in FIG. 3, the size and shape of the first cutting part 110 and the second cutting part 120 may partially correspond to each other, and when the size of the component 30 is relatively small, the size and shape of the first cutting part 110 and the second cutting part 120 may entirely correspond to each other. The first and second cutting parts 110 and 120 may have a structure corresponding to an external shape of the component 30 entirely or partially. For example, when the outer contour of the component 30 is circular, the first and second cutting parts 110 and 120 may have a circular or "U"-shaped structure, and when the outer contour of the component 30 is tetragonal, the first and second cutting parts 110 and 120 may have a rectangular shape.

When the first cutting part 110 and the second cutting part 120 are bonded to each other after being individually formed when they are bonded through ACF bonding, the first cutting part 110 and the second cutting part 120 do not agree with each other along the accommodation direction of the component 30 due to thermal deformation so that an alignment thereof is not precisely made, an increase of bezels cannot be prevented and an inferior product may be produced because the component 30 cannot be stably accommodated in the first and second cutting parts 110 and 120.

Because the first and second cutting parts 110 and 120 are formed at the same time at a portion at which the display substrate 20 and the flexible printed circuit board 40 are bonded to each other by the bonding layer 50, at least at portions of the first cutting part 110 and the second cutting part 120 are aligned along the accommodation direction (cutting direction) of a component. Accordingly, an alignment thereof may be precise, and thus in step S3 of FIG. 7, the component 30 may be stably accommodated in the first cutting part 110 and the second cutting part 120, as illustrated in FIG. 2.

In this way, because the first cutting part 110 and the second cutting part 120 are formed at the same time while the display substrate 20 and the flexible printed circuit board 40 are bonded to each other, an accommodation space, into which at least a portion of the component 30 may be inserted from a periphery of one side of the display substrate 20, may be sufficiently secured. Accordingly, the width of the first bezel B1 due to the components 30 installed adjacent to a periphery of the display substrate 20 may be reduced. For example, when the component 30 is a camera, at least a portion of the component 30 is inserted into an inside of a periphery of the display substrate 20 by the first and second cutting parts 110 and 120, even when the size of the camera is large due to an increase of the specification of the camera, so that an increase in the width of the first bezel B1 can be prevented or the width of the bezel B1 can be reduced.

The sizes of the first and second cutting parts 110 and 120 may be larger than the size of the component 30 so that the component 30 accommodated in the first and second cutting parts 110 and 120 may be prevented from contacting the cut surfaces of the first and second cutting parts 110 and 120.

As shown in FIGS. 8, 10, and 12, an electrode part 41 and a non-electrode part 42 may be formed at a periphery of one side of the flexible printed circuit board 40. The electrode part 41 may be an area in which an electrode pattern such as one or more conductive patterns or a conductive line is formed, such that signals are transmitted and received between the driver IC 55 and the display substrate 20. The electrode part 41 may extend from the first part 46 of the flexible printed circuit board 40 via the third part 45.

The non-electrode part 42 may be an area in which an electrode pattern is not formed such that a signal is not transmitted and received between the driver IC 55 and the display substrate 20. The recessed second cutting part 120 may be formed in the non-electrode part 42. In detail, the flexible printed circuit board 40 may have a first non-conductive layer that faces the first direction of the housing 11, a second non-conductive layer that faces the second direction of the housing 11, and a metal pad or metal pattern disposed between the first non-conductive layer and the second non-conductive layer. Here, the first non-conductive layer and the second non-conductive layer may correspond to the non-electrode part 42, and the metal pad or metal pattern may correspond to the to electrode part 41. The metal pad or metal pattern may be arranged along at least one periphery of the first and second cutting parts 110 and 120. Further, the metal pad or metal pattern may be electrically isolated by the non-electrode part 42 that corresponds to the first and second non-conductive layers.

As illustrated in FIGS. 8 to 13, a plurality of via holes 43 may be formed in advance before the second cutting part 120 is formed in the non-electrode part 42. The first and second cutting parts 110 and 120 may be formed precisely and easily through the plurality of via holes 43. Because the first and second cutting parts 110 and 120 are formed through the plurality of via holes 43, a plurality of channels or troughs may be formed at a periphery of the first and second cutting parts 110 and 120 as one or more via holes 43 cross the cut surface of the second cutting part 120, as illustrated in FIGS. 3 and 5. Accordingly, the cut surface formed along the first and second cutting parts 110 and 120 of the first pat 46 and the second part 47 of the flexible printed circuit board 40 may have a plurality of channels or troughs. The cut surface formed along the first and second cutting parts 110 and 120 of the third part 45 of the flexible printed circuit board 40 may have a plurality of channels or troughs.

Further, a dummy pattern 44 may be formed at an outer side of the non-electrode part 42. The dummy pattern 44 may extend along at least a portion of the non-electrode part 42 and/or the second cutting part 120, as shown in FIG. 4. The dummy pattern 44 may have a structure that surrounds the non-electrode part 42 and/or the second cutting part 120, as shown in FIG. 5. The dummy pattern 44 is a pattern that is electrically short-circuited from the display substrate 20 and/or the connector 40. The dummy pattern 44 may be formed to be separated from a periphery of the second cutting part 120 by a spacing gap s. Because the dummy pattern 44 has a width t, the vulnerable strength of the flexible printed circuit board 40 due to the formation of the second cutting part 120 maybe reinforced. For example, the spacing gap s between the dummy pattern 44 and the second cutting part 120 may be approximately 0.7 mm, and the width t of the dummy pattern 44 may be approximately 0.3 mm to 0.8 mm.

Further, as shown in FIG. 6, a cover member 60 that covers the display substrate 20 and the flexible printed circuit board 40, which is a connector, may be installed on the front surface of the display substrate 20. A third cutting part 130 corresponding to the first and second cutting parts 110 and 120 may be formed in the cover member 60, and accordingly, the component 30 may be stably accommodated within the first cutting part 110, the second cutting part 120, and the third cutting part 130.

According to an embodiment, the cover member 60 may be a touch screen panel (TSP) that performs a touch screen function for the display substrate 20. A touch screen driving circuit board 63 may be connected to a periphery of one side of the touch screen panel 60. A third cutting part 130 corresponding to the first and second cutting parts 110 and 120 may be formed in the touch screen panel 60 and the touch screen driving circuit board 63, and at least a portion of the component 30 may be accommodated in the third cutting part 130.

According to another embodiment, the cover member 60 may be a protective film for protecting the display substrate 20 and the flexible printed circuit board 40 that is a connector. The third cutting part 130 may be formed at a periphery of one side of the protective film.

Referring to FIGS. 8 to 13, a scheduled area in which the first cutting part 110 of the display substrate 20 and the second cutting part 120 of the flexible printed circuit board 40 may be set. That is, wrong positioning of the first and second cutting parts 110 and 120 may be prevented when the first and second cutting parts 110 and 120 are formed, by presetting the formation locations of the first and second cutting parts 110 and 120 at a portion at which the display substrate 20 and the flexible printed circuit 40 overlap each other and then are bonded to each other.

As illustrated in FIGS. 8 and 9, a plurality of via holes 43 may be machined in advance at a portion at which the display substrate 20 and the flexible printed circuit board 40 overlap each other.

The plurality of via holes 43 may be formed in the non-electrode part 42 of the flexible printed circuit board 40. The first and second cutting parts 110 and 120 may be formed more easily through the plurality of via holes 43.

As illustrated in FIGS. 10 and 11, after the via holes 43 are machined, a periphery of one side of the first surface of the display substrate 20 and the first part 40 of the flexible printed circuit board 40 may be bonded to each other by the bonding layer 50. Here, FIG. 11 is a sectional view taken along line C-C of FIG. 10.

According to an embodiment, the bonding layer 50 may be an ACF. Because the bonding layer 50 is pressed upwards and downwards after being interposed between an electrode pattern provided at a periphery of one side of the flexible printed circuit board 40 and an electrode pattern provided at a periphery of one side of the display substrate 20, the first part 46 of the flexible printed circuit board 40 and the first surface 26 of the display substrate 20 may be physically bonded and electrically connected to each other.

Thereafter, as illustrated in FIGS. 12 and 13, as the flexible printed circuit board 40 is bent from the first surface 26 of the display substrate 20 towards the second surface 27 of the display substrate 20 with respect to the bonding layer 50, the third part 45 of the flexible printed circuit board 40 may cover at least a portion of the third surface 25 of the display substrate 20 and the second part 47 of the flexible printed circuit board 40 may be arranged on the second surface 27 of the display substrate 20. In this state, the first and second cutting parts 110 and 120 for accommodating the component 30 may be formed at the same time. According to an embodiment, the first and second cutting parts 110 and 120 may be formed by cutting the portions at which the display substrate 20 and the flexible printed circuit board 40 are bonded to each other at the same time with a cutting tool such as a pinnacle die having an embossed cutting blade. According to another embodiment, the first and second cutting parts 110 and 120 may be formed by cutting the portions at which the display substrate 20 and the FPCB 40 overlap each other at the same time through irradiation of a laser beam of a laser device that is driven in a PWM control method. In particular, the display substrate 20 and/or the flexible printed circuit board 40 may be burned or deformed by heat when a laser beam irradiated by the laser device is of high power, the formation precision of the first and second cutting parts 110 and 120 may be improved by irradiating the laser beam under a PWM output control to lower the laser device to a low electric power by which deformation due to heat is not generated.

When the first and second cutting parts 110 and 120 are formed, the display substrate 20 is mounted in the housing 11, and other components may be mounted while the component 30 is accommodated in the first and second cutting parts 110 and 120. Thereafter, the cover member 60 having the third cutting part 130 corresponding to the first and second cutting parts 110 and 120 may be installed on the front surface of the display substrate 20, and then the window 12 may be installed on the front surface of the cover member 60.

Figure 20:
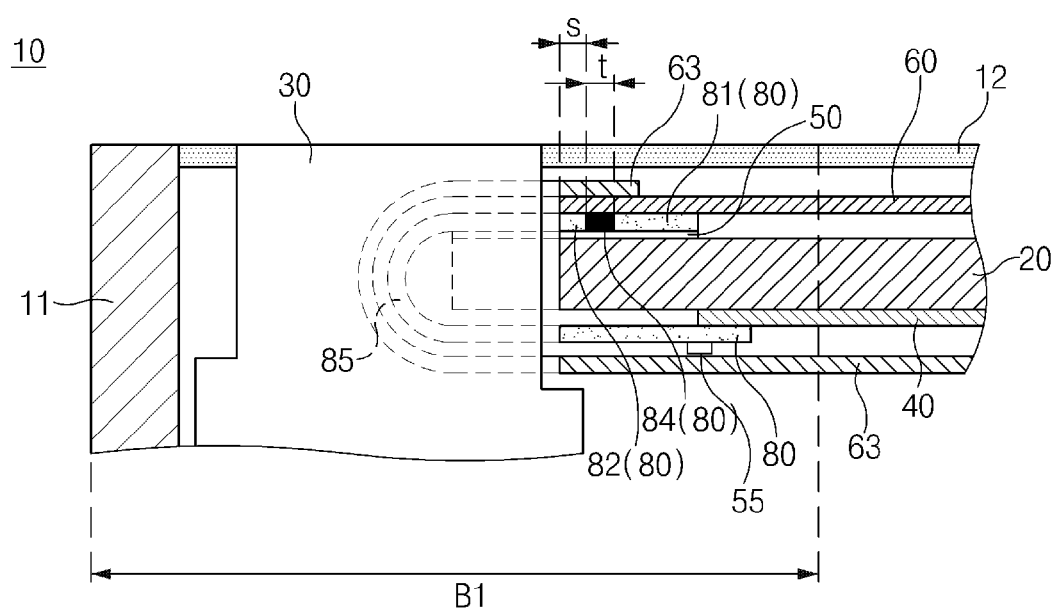
FIG. 20 is a sectional view illustrating a state in which a component is accommodated in a first cutting part and a second cutting part of an electronic device, according to an embodiment of the present disclosure.

FIG. 20 is a sectional view illustrating a state in which a component is accommodated in a first cutting part and a second cutting part of an electronic device, according to an embodiment of the present disclosure.

Referring to FIG. 20, an electrode pattern may be formed in a peripheral area 22 of one side of the display substrate 20. A first connector, i.e., the flexible printed circuit board 40, and a second connector 80 that transmits a driving signal of the display substrate 20 may be connected to an electrode pattern of the display substrate 20, and the display substrate 20 may be electrically connected to a main board through the flexible printed circuit board 40 and the second connector 80.

The second connector 80 has a property different from that of the flexible printed circuit board 40. According to an embodiment, the second connector 80 may include at least one of a chip on film (COF) and a tape carrier package (TCP). The second connector 80 may be bonded to or integrally formed with one side of the flexible printed circuit board 40. Because the second connector 80 is formed of a material that is more flexible than that of the flexible printed circuit board 40 or is thinner than the flexible printed circuit board 40, it may be bent more smoothly. The second connector 80 is bonded to a periphery of the peripheral area 22 of one side of the display substrate 20 by the bonding layer 50, and accordingly, the second connector 80 may be electrically connected to the main board (not illustrated) through the flexible printed circuit board 40.

Figure 18:
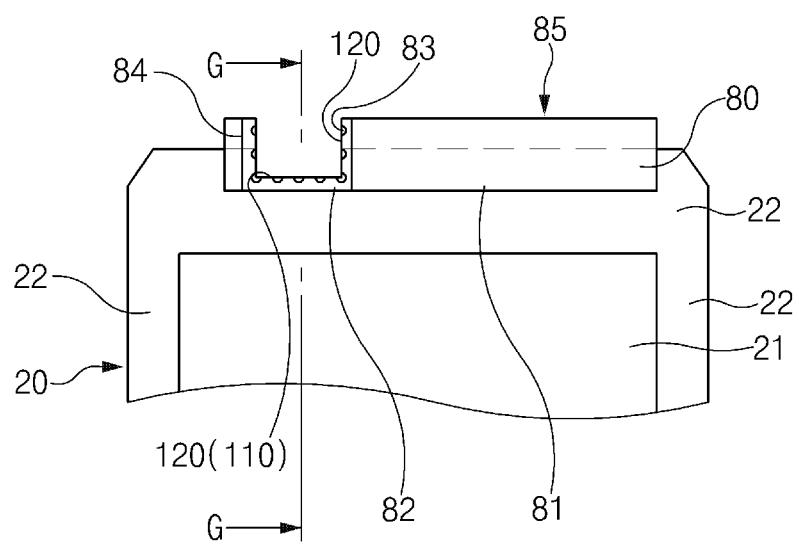
FIG. 18 is a plan view illustrating a first and second cutting parts are formed at a portion at which a display substrate and a chip on film (COF) of an electronic device are bonded to each other, according to an embodiment of the present disclosure.
Figure 19:
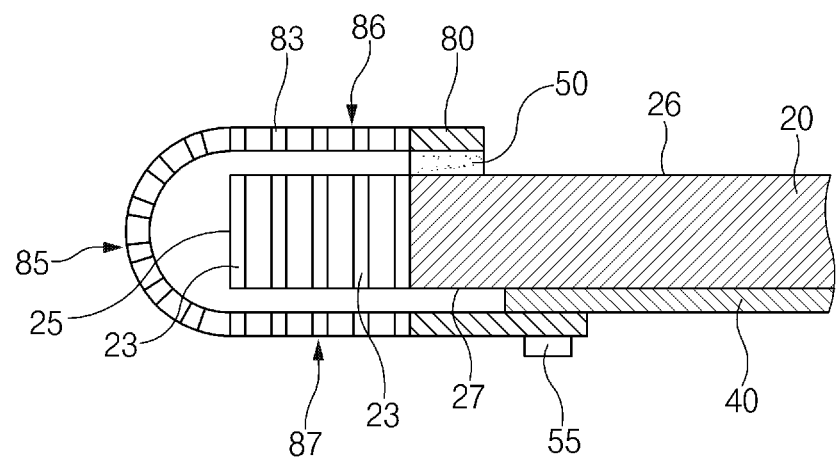
FIG. 19 is a sectional view taken along line G-G of FIG. 18, according to an embodiment of the present disclosure.

FIG. 18 is a plan view illustrating a first and second cutting parts are formed at a portion at which a display substrate and a chip on film (COF) of an electronic device are bonded to each other, according to an embodiment of the present disclosure. FIG. 19 is a sectional view taken along line G-G of FIG. 18, according to an embodiment of the present disclosure.

Referring to FIGS. 18 and 19, the second connector 80 has a first part 86 arranged on the first surface 26 of the display substrate 20, a second part 87 arranged on the second surface 27 of the display substrate 20, and a third part 85 that extends from the first part 86 to the second part 87, as illustrated in FIG. 19. The third part 85 may be formed to cover at least a portion of the third surface 25 of the display substrate 20. The first part 86 of the second connector 80 may be bonded to a periphery of the first surface 20 of the display substrate 20.

Because the flexible printed circuit board 40 and the second connector 80 includes a driver IC 55, the display substrate 20 may have an unbreakable plate including a substrate of a flexible material, such as a synthetic resin. In this way, the driver IC 55 may not be mounted on the display substrate 20 having the unbreakable plate.

According to an embodiment, the bonding layer 50 is an ACF, and because the bonding layer 50 is pressed after being interposed between an electrode pattern provided at a periphery of one side of the second connector 80 and an electrode pattern provided at a periphery of one side of the display substrate 20, the second connector 80 and the display substrate 20 may be physically bonded or electrically connected to each other very firmly.

Further, a recess for accommodating the component 30 may be formed at a portion at which the display substrate 20 and the second connector 80 are bonded to each other by the bonding layer 50. The recess may be formed by cutting the first and second cutting part 110 and 120 at the same time. The first and second cutting parts 110 and 120 may be cut by a pinnacle die having an embossed cutting blade, or may be cut through a PWM control method of a laser.

The first cutting part 110 may be formed in a peripheral area 22 of the display substrate 20. The second cutting part 120 may be formed at a periphery of one side of the second connector 80 that is bonded to the display substrate 20.

The size and shape of the first cutting part 110 and the second cutting part 120 may correspond to each other partially or entirely according to the shape or size of the component 30. For example, when the size of the component 30 is relatively large, as shown in FIG. 6, the size and shape of the first cutting part 110 and the second cutting part 120 may partially correspond to each other, and when the size of the component 30 is relatively small, the size and shape of the first cutting part 110 and the second cutting part 120 may entirely correspond to each other. Further, the first and second cutting parts 110 and 120 may have a structure corresponding to an external shape of the component 30 entirely or partially. For example, when the outer contour of the component 30 is circular, the first and second cutting parts 110 and 120 may have a circular or "U"-shaped structure, and when the outer contour of the component 30 is tetragonal, the first and second cutting parts 110 and 120 may have a rectangular shape.

When the first cutting part 110 and the second cutting part 120 are bonded to each other through ACF bonding after being individually formed, so that an alignment of the first cutting part 110 and the second cutting part 120 is not precisely made, an increase of the width of a bezel cannot be prevented and an inferior product may be produced because the component 30 cannot be stably accommodated in the first and second cutting parts 110 and 120. In this regard, because the first and second cutting parts 110 and 120 are formed at a portion at which the display substrate 20 and the second connector 80 are bonded to each other by the bonding layer 50 at the same time, at least portions of the first cutting part 110 and the second cutting part 120 agree with each other or are aligned along the accommodation direction (cutting direction) of the component 30, and accordingly, the component 30 may be stably accommodated in the first cutting part 110 and the second cutting part 120 as illustrated in FIG. 20.

In this way, because the first cutting part 110 and the second cutting part 120 are formed at the same time while the display substrate 20 and the second connector 80 are bonded to each other, a sufficient accommodation space into which at least a portion of the component 30 may be inserted from a periphery of one side of the display substrate 20 may be secured. Accordingly, the width of the first bezel B1 due to the components 30 installed adjacent to a periphery of the display substrate 20 may be reduced. For example, when the component 30 is a camera, at least a portion of the component 30 is inserted into an inside of a periphery of the display substrate 20 by the first and second cutting parts 110 and 120 even when the size of the camera is large due to an increase of the specification of the camera so that an increase in the width of the first bezel B1 can be prevented or the width of the first bezel B1 can be reduced, and accordingly, the degree of freedom of design of the electronic device 10 may be increased, making it possible to increase a competitiveness of the product.

Further, the sizes of the first and second cutting parts 110 and 120 may be larger than the size of the component 30 so that the component 30 accommodated in the first and second cutting parts 110 and 120 may be prevented from contacting the cut surfaces of the first and second cutting parts 110 and 120.

Referring to FIGS. 18 and 20, an electrode part 81 and a non-electrode part 82 are formed at a periphery of one side of the second connector 80. The electrode part 81 is an area in which an electrode pattern such as at least one conductive pattern or a conductive line is formed such that a signal may be transmitted and received between the driver IC 55 and the display substrate 20, and the electrode part 81 may extend from the first part 86 of the second connector 80 via the third part 85. The non-electrode part 82 is an area in which an electrode pattern is not formed such that a signal is not transmitted and received between the driver IC 55 and the display substrate 20, and the second cutting part 120 may be formed in the non-electrode part 82.

Figure 14:
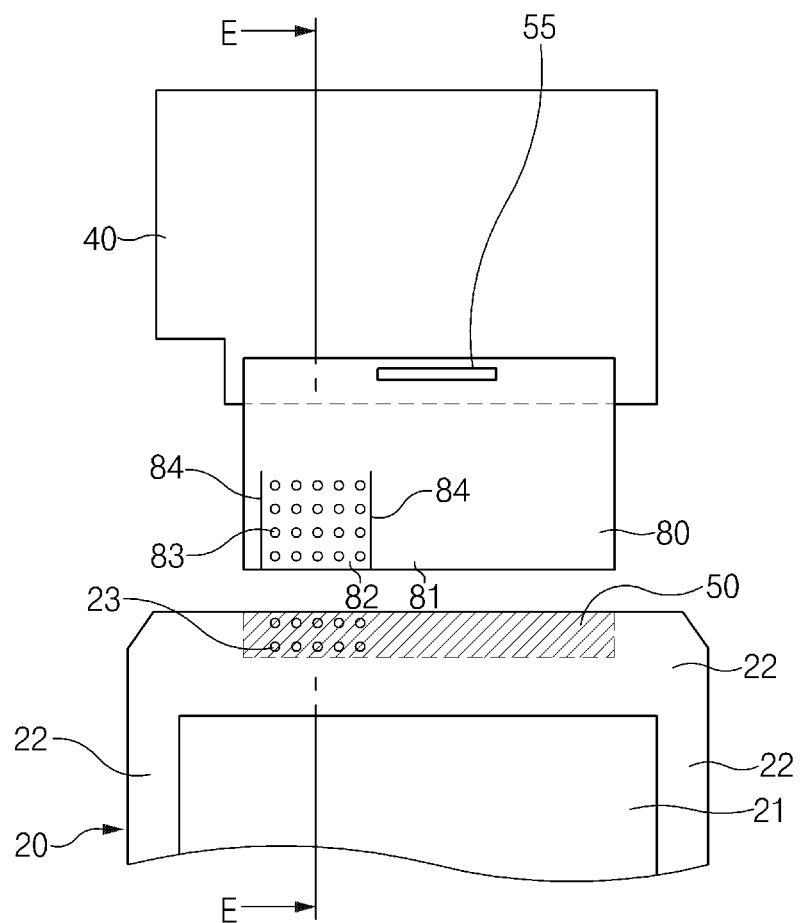
FIG. 14 is a plan view illustrating a state before a display substrate and a chip on film (COF) of an electronic device is bonded to each other, according to an embodiment of the present disclosure.
Figure 15:
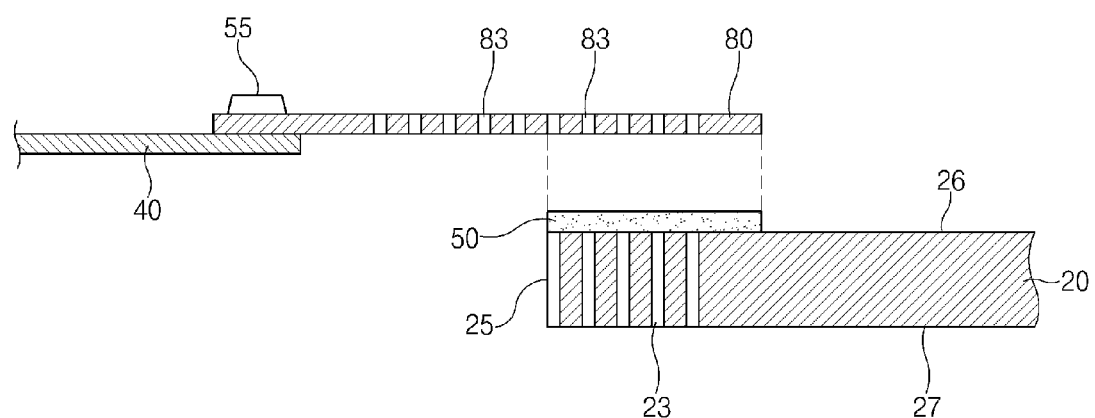
FIG. 15 is a sectional view taken along line E-E of FIG. 14, according to an embodiment of the present disclosure.
Figure 16:
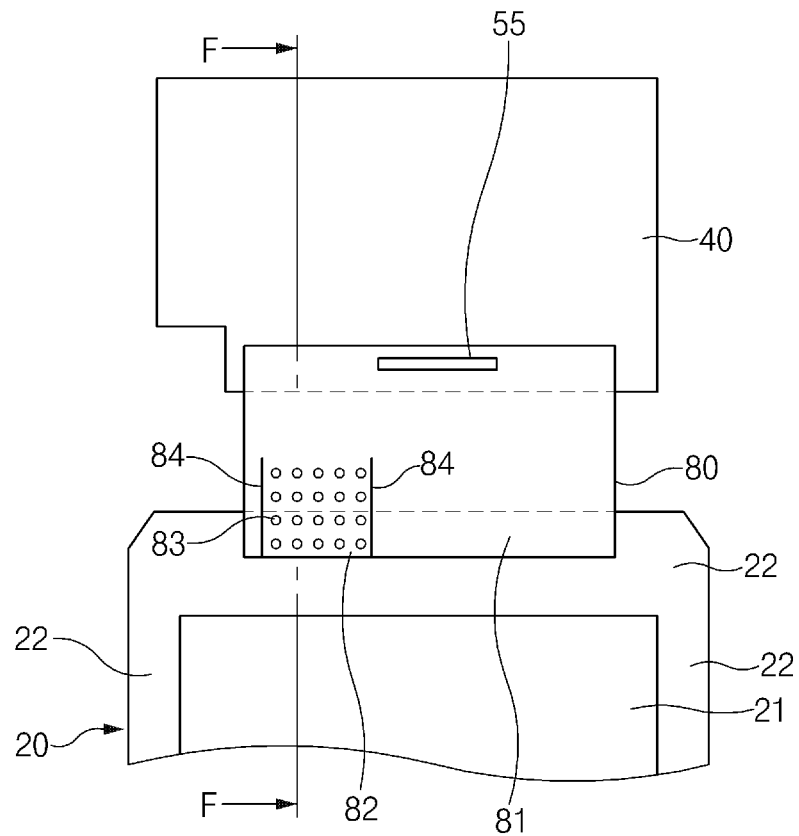
FIG. 16 is a plan view illustrating a state in which a display substrate and a chip on film (COF) of an electronic device are bonded to each other, according to an embodiment of the present disclosure.
Figure 17:
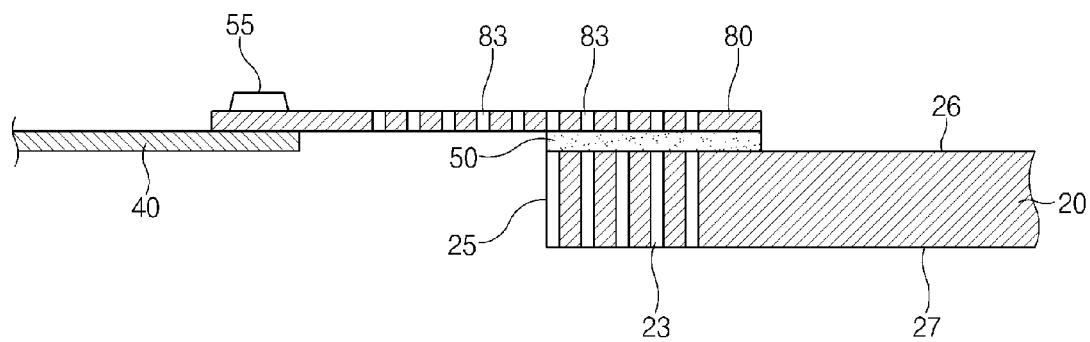
FIG. 17 is a sectional view taken along line F-F of FIG. 16, according to an embodiment of the present disclosure.

FIG. 14 is a plan view illustrating a state before a display substrate and a chip on film (COF) of an electronic device is bonded to each other, according to an embodiment of the present disclosure. FIG. 15 is a sectional view taken along line E-E of FIG. 14, according to an embodiment of the present disclosure. FIG. 16 is a plan view illustrating a state in which a display substrate and a chip on film (COF) of an electronic device are bonded to each other, according to an embodiment of the present disclosure. FIG. 17 is a sectional view taken along line F-F of FIG. 16, according to an embodiment of the present disclosure.

Referring to FIGS. 14 to 17 and referring back to FIGS. 18 and 19, a process of assembling an electronic device is illustrated. As shown in FIGS. 14 to 19, a plurality of second via holes 83 may be formed in advance before the second cutting part 120 is formed in the non-electrode part 82, and a plurality of first via holes 23 may be formed at a periphery of one side of the display substrate 20 corresponding to the second via holes 83 of the second connector 80.

The first and second cutting parts 110 and 120 may be formed precisely and easily through the plurality of first and second via holes 23 and 83. As shown in FIG. 18, because the first and second cutting parts 110 and 120 are formed through the plurality of first and second via holes 23 and 43, a plurality of channels or troughs may be formed at a periphery of the second cutting part 120 as one or more first and second via holes 23 and 83 cross the cut surface of the first and second cutting part 110 and 120. The cut surface formed along the first and second cutting parts 110 and 120 of the first pat 86 and to the second part 87 of the second connector 80 may have a plurality of channels or troughs. The cut surface formed along the first and second cutting parts 110 and 120 of the third part 85 of the second connector 80 may have a plurality of channels or troughs.

Further, a dummy pattern 84 may be formed at an outer side of the non-electrode part 82, and the dummy pattern 84 may extend along a peripheral portion of the non-electrode part 82 and/or the second cutting part 120 or surround a periphery of the non-electrode part 82 and/or the second cutting part 120. In particular, the dummy pattern 84 may be spaced apart from a periphery of the second cutting part 120 by a space gap s, and because the dummy pattern 84 has a width t, the vulnerable strength of the second connector 80 may be reinforced due to the formation of the second cutting part 120. For example, as shown in FIG. 20, the spacing gap s between the dummy pattern 84 and the second cutting part 120 may be approximately 0.7 mm, and the width t of the dummy pattern 84 is approximately 0.3 mm to 0.8 mm.

Further, a cover member 60 that covers the display substrate 20 and the second connector 80 may be installed on the front surface of the display substrate 20. A third cutting part 130 corresponding to the first and second cutting parts 110 and 120 may be formed in the cover member 60, and accordingly, the component 30 may be stably accommodated within the first cutting part 110, the second cutting part 120, and the third cutting part 130.

Referring to FIGS. 14 to 19, a scheduled area in which the first cutting part 110 of the display substrate 20 and the second cutting part 120 of the second connector 80 is set. That is, wrong positioning of the first and second cutting parts 110 and 120 may be prevented when the first and second cutting parts 110 and 120 are formed, by presetting the formation locations of the first and second cutting parts 110 and 120 at a portion at which the display substrate 20 and the second connector 80 overlap each other and then are bonded to each other.

As illustrated in FIGS. 14 and 15, a plurality of first via holes 23 and a plurality of second via holes 83 are machined to correspond to each other, at a portion at which the display substrate 20 and the second connector 80 overlap each other and are bonded to each other. The plurality of first via holes 23 may be formed in a peripheral area 22 of one side of the display substrate 20, and the plurality of second via holes 83 may be formed in the non-electrode part 82 of the second connector 80. The first and second cutting parts 110 and 120 may be formed more easily through the plurality of first via holes 23 and the plurality of second via holes 83.

As illustrated in FIGS. 16 and 17, after the via holes 23 and 83 are machined, a periphery of one side of the display substrate 20 and a periphery of one side of the second connector 80 may be bonded to each other by the bonding layer 50.

According to an embodiment, the bonding layer 50 is an ACF, and because the bonding layer 50 is pressed after being interposed between an electrode pattern provided at a periphery of one side of the second connector 80 and an electrode pattern provided at a periphery of one side of the display substrate 20, the first part 86 of the second connector 80 and the first surface 26 of the display substrate 20 may be physically bonded or electrically connected to each other.

Thereafter, as in FIGS. 18 and 19, as the second connector 80 is bent from the first surface 26 of the display substrate 20 towards the second surface 27 of the display substrate 20 with respect to the bonding layer 50, the third part 85 of the second connector 80 may cover at least a portion of the third surface 25 of the display substrate 20 and the second surface 87 of the second connector 80 may be arranged on the second surface 27 of the display substrate 20. In this state, the first and second cutting parts 110 and 120 for accommodating the component 30 may be formed at the same time.

According to an embodiment, the first and second cutting parts 110 and 120 may be formed by cutting the portions at which the display substrate 20 and the second connector 80 are bonded to each other at the same time with a cutting tool such as a pinnacle die having an embossed cutting blade. According to another embodiment, the first and second cutting parts 110 and 120 may be formed by cutting the portions at which the display substrate 20 and the second connector 80 are bonded to each other at the same time through irradiation of a laser beam of a laser device driven in a PWM control method. Because the display substrate 20 and/or the second connector 80 may be burned or deformed by heat when a laser beam irradiated by the laser device is of high power, the formation precision of the first and second cutting parts 110 and 120 may be improved by irradiating the laser beam under a PWM output control to lower the lower of the laser device to a low electric power by which deformation due to heat is not generated.

When the first and second cutting parts 110 and 120 are formed, the display substrate 20 is mounted in the housing 11, and other components may be properly mounted while the component 30 is accommodated in the first and second cutting parts 110 and 120. The cover member 60 having the third cutting part 130 corresponding to the first and second cutting parts 110 and 120 may be installed on the front surface of the display substrate 20, and then the window 12 may be installed on the front surface of the cover member 60.

According to various embodiments of the present disclosure, the width of the bezel can be prevented from increasing in size or can be decreased by compactly installing components installed at a periphery of a display substrate between the housing and the display substrate.

As described above, according to various embodiments of the present disclosure, an electronic device includes a display substrate and a connector connected to one side of the display substrate and having a dummy pattern. A cutting part may be formed in the display substrate and the connector, and the cutting part may be formed adjacent to the dummy pattern.

According to various embodiments of the present disclosure, at least an area of the connector and at least an area of the display substrate may be bonded to each other through a conductive bonding layer.

According to various embodiments of the present disclosure, the conductive bonding layer includes an anisotropic conductive film.

According to various embodiments of the present disclosure, the connector includes a flexible printed circuit board.

According to various embodiments of the present disclosure, the cutting part includes a first cutting part formed on one side of the display substrate and a second cutting part formed on one side of the connector.

According to various embodiments of the present disclosure, the connector may be bent to surround a periphery of one side of the display substrate, and at least a portion of the first cutting part and at least a portion of the second cutting part may be aligned according to a cutting direction thereof.

According to various embodiments of the present disclosure, the dummy pattern may be separated from a periphery of the second cutting part by a spacing gap and has a width.

According to various embodiments of the present disclosure, the connector includes a first connector and a second connector having a property different from that of the first connector.

According to various embodiments of the present disclosure, the first connector includes a flexible printed circuit board, the second connector may be connected to one side of the first connector, and the second connector and the display substrate may be bonded to each other by the conductive bonding layer.

According to various embodiments of the present disclosure, the second connector has an electrode part that has an electrode pattern and a non-electrode part that does not have an electrode pattern, and the second cutting part may be formed in the non-electrode part of the second connector.

According to various embodiments of the present disclosure, the dummy pattern may be formed at an outer side of the second cutting part, and the dummy pattern may extend along at least a portion of the second cutting part.

According to various embodiments of the present disclosure, the dummy pattern may be spaced apart from a periphery of the second cutting part by a spacing gap and has a width.

According to various embodiments of the present disclosure, an electronic device includes a display substrate and a connector connected to one side of the display substrate and having a dummy pattern. A plurality of via holes may be formed adjacent to the dummy pattern, and a cutting part may be formed in the display substrate and the connector, and a cut surface of the cutting part may be formed to cross at least a portion of the plurality of via holes.

According to various embodiments of the present disclosure, an electronic device includes a housing comprising a first plate facing a first direction and a second plate facing a second direction opposite to the first direction, a display disposed within the housing and exposed through the first plate, and a component disposed adjacent to the display, when viewed from the top of the first plate. The display includes a display substrate having a first surface disposed in parallel to the first plate and facing the first direction, a second surface facing the second direction, and a third surface facing a third direction that is substantially perpendicular to the first surface, and a connector having a first part disposed on the first surface, a second part disposed on the second surface, and a third part extending from the first part to the second part and covering at least a portion of the third surface. A peripheral portion of the display substrate includes a recess. Portions of the first part, the second part, and the third part of the connector may be cut along the recess of the display substrate, when viewed from above the first plate. The connector includes a first non-conductive layer facing the first direction, a second non-conductive layer facing the second direction, and a metal pad or pattern disposed along at least a portion of a periphery of the recess and inserted between the first non-conductive layer and the second non-conductive layer, in which the metal pad or pattern is electrically isolated. And at least a portion of the component may be disposed in the recess, when viewed from above the first plate.

According to various embodiments of the present disclosure, the surfaces of the first part and/or the second part of the connector, which are formed along the recess, include a plurality of channels or troughs.

According to various embodiments of the present disclosure, a surface of the third part of the connector, which is formed along the recess, includes a plurality of channels or troughs.

According to various embodiments of the present disclosure, the display substrate includes a glass plate, and a portion of a side surface of the glass plate may be exposed to the recess.

According to various embodiments of the present disclosure, the display includes a screen area and a peripheral area surrounding the screen area, when viewed from above the first plate and the recess may be formed in the peripheral area.

According to various embodiments of the present disclosure, the screen area includes a first side having a first length, a second side extending from one end of the first side to be perpendicular to the first side and having a second length that is longer than the first length, a third side extending from one end of the second side to be perpendicular to the second side and having the first length, and a fourth side extending from one end of the third side to be perpendicular to the third side and having the second length, and the recess may be formed adjacent to the first side.

According to various embodiments of the present disclosure, the recess may be formed adjacent to the second side or the fourth side.

According to various embodiments of the present disclosure, a method for assembling an electronic device includes bonding a display substrate and a connector by a conductive bonding layer, cutting the display substrate and the connector at a portion at which the display substrate and the connector is bonded to each other, and accommodating at least one component in a cutting part of the display substrate and the connector.

According to various embodiments of the present disclosure, the method may further include setting a formation location of the cutting part at the portion at which the display substrate and the connector are bonded to each other in advance before bonding the display substrate and the connector.

According to various embodiments of the present disclosure, the setting the formation location of the cutting part includes machining a plurality of via holes at the portion at which the display substrate and the connector is bonded to each other.

Figure 21:
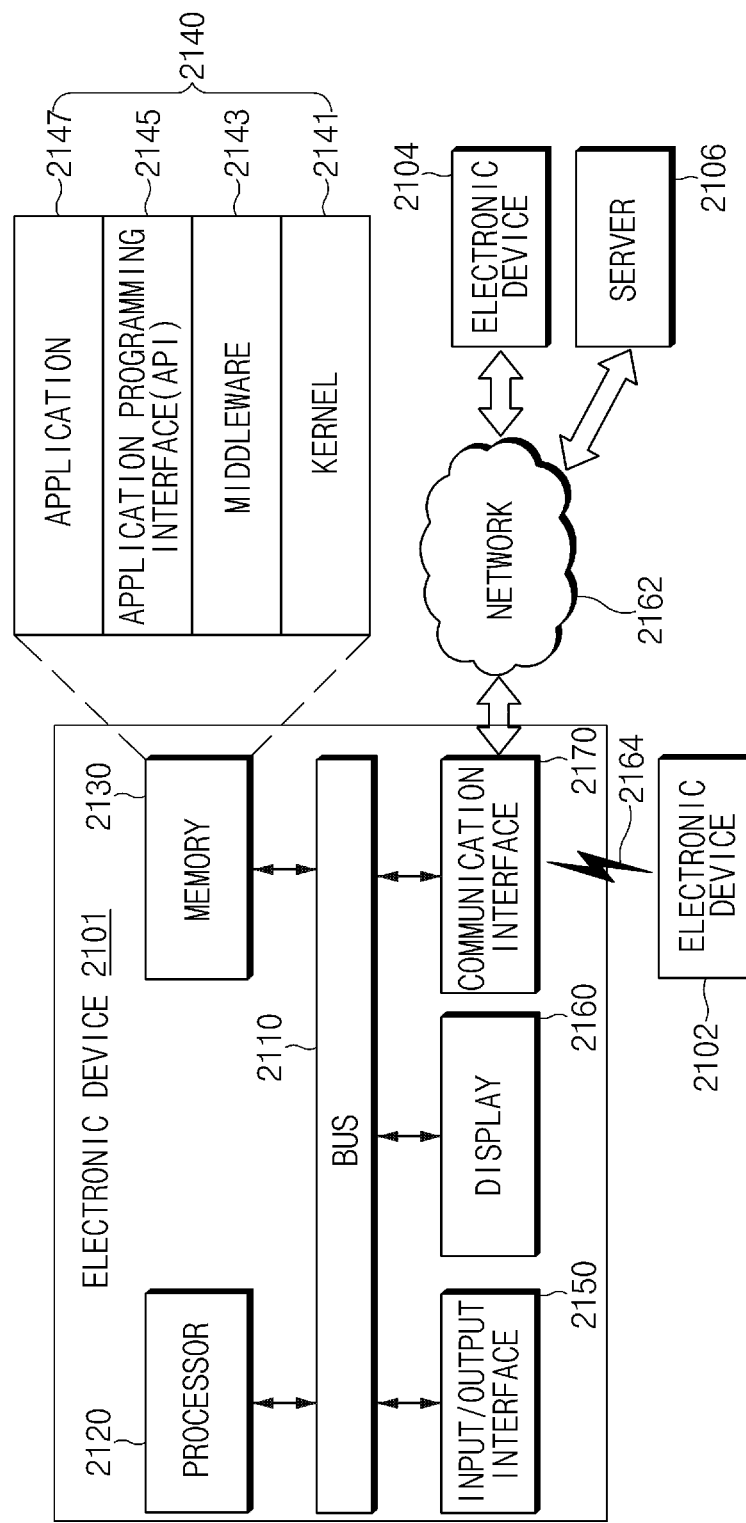
FIG. 21 is a block diagram of an electronic device in a network environment, according to an embodiment of the present disclosure.

FIG. 21 is a block diagram of an electronic device in a network environment, according to an embodiment of the present disclosure.

Referring to FIG. 21, an electronic device 2101 in a network environment is shown. The electronic device 2101 includes a bus 2110, a processor 2120, a memory 2130, an input/output interface 2150, a display 2160, and a communication interface 2170. In various embodiments of the present disclosure, at least one of the foregoing elements may be omitted or another element may be added to the electronic device 2101.

The bus 2110 is a circuit for connecting the above-mentioned elements 2110 to 2170 to each other and transferring communications (e.g., control messages and/or data) among the above-mentioned elements.

The processor 2120 includes at least one of a central processing unit (CPU), an application processor (AP), or a communication processor (CP). The processor 2120 may perform data processing or an operation related to communication and/or control of at least one of the other elements of the electronic device 2101.

The memory 2130 includes a volatile memory and/or a nonvolatile memory. The memory 2130 may store instructions or data related to at least one of the other elements of the electronic device 2101. According to an embodiment of the present disclosure, the memory 2130 may store software and/or a program 2140. The program 2140 includes, a kernel 2141, a middleware 2143, an application programming interface (API) 2145, and/or an application 2147. At least a portion of the kernel 2141, the middleware 2143, or the API 2145 may be referred to as an operating system (OS).

The kernel 2141 may control or manage system resources (e.g., the bus 2110, the processor 2120, the memory 2130, etc.) used to perform operations or functions of other programs (e.g., the middleware 2143, the API 2145, or the application 2147). Furthermore, the kernel 2141 may provide an interface for allowing the middleware 2143, the API 2145, or the application 2147 to access individual elements of the electronic device 2101 in order to control or manage the system resources.

The middleware 2143 may serve as an intermediary so that the API 2145 or the application 2147 communicates and exchanges data with the kernel 2141.

Furthermore, the middleware 2143 may handle one or more task requests received from the application 2147 according to a priority order. For example, the middleware 2143 may assign at least one application program 2147 a priority for using the system resources (e.g., the bus 2110, the processor 2120, the memory 2130, etc.) of the electronic device 2101. For example, the middleware 2143 may handle the one or more task requests according to the priority assigned to the at least one application 2147, thereby performing scheduling or load balancing with respect to the one or more task requests.

The API 2145, which is an interface for allowing the application 2147 to control a function provided by the kernel 2141 or the middleware 2143, may include at least one interface or function (e.g., instructions) for file control, window control, image processing, character control, etc.

The input/output interface 2150 transfers an instruction or data input from a user or another external device to other elements of the electronic device 2101. Furthermore, the input/output interface 2150 may output instructions or data received from another element of the electronic device 2101 to the user or another external device.

The display 2160 includes, for example, an LCD, an LED display, an OLED display, a microelectromechanical systems (MEMS) display, or an electronic paper display. The display 2160 may present various content (e.g., a text, an image, a video, an icon, a symbol, etc.) to the user. The display 2160 includes a touch screen, and may receive a touch, gesture, proximity or hovering input from an electronic pen or a part of a body of the user.

The communication interface 2170 may set communications between the electronic device 2101 and an external device (e.g., a first external electronic device 2102, a second external electronic device 2104, or a server 2106). For example, the communication interface 2170 may be connected to a network 2162 via wireless communications or wired communications so as to communicate with the external device (e.g., the second external electronic device 2104 or the server 2106).

The wireless communications may employ at least one of cellular communication protocols such as long-term evolution (LTE), LTE-advance (LTE-A), code division multiple access (CDMA), wideband CDMA (WCDMA), universal mobile telecommunications system (UMTS), wireless broadband (WiBro), or global system for mobile communications (GSM). The wireless communications includes, for example, a short-range communications 2164. The short-range communications may include at least one of Wi-Fi, Bluetooth, near field communication (NFC), magnetic stripe transmission (MST), or GNSS.

The MST may generate pulses according to transmission data and the pulses may generate electromagnetic signals. The electronic device 2101 may transmit the electromagnetic signals to a reader device such as a POS (point of sales) device. The POS device may detect the magnetic signals by using a MST reader and restore data by converting the detected electromagnetic signals into electrical signals.

The GNSS includes, for example, at least one of global positioning system (GPS), global navigation satellite system (GLONASS), BeiDou navigation satellite system (BeiDou), or Galileo, the European global satellite-based navigation system according to a use area or a bandwidth. Hereinafter, the term "GPS" and the term "GNSS" may be interchangeably used. The wired communications may include at least one of universal serial bus (USB), high definition multimedia interface (HDMI), recommended standard 832 (RS-232), plain old telephone service (POTS), etc. The network 2162 may include at least one of telecommunications networks, for example, a computer network (e.g., local area network (LAN) or wide area network (WAN)), the Internet, or a telephone network.

The types of the first external electronic device 2102 and the second external electronic device 2104 may be the same as or different from the type of the electronic device 2101.

According to an embodiment of the present disclosure, the server 2106 may include a group of one or more servers. A portion or all of operations performed in the electronic device 2101 may be performed in one or more other electronic devices (e.g., the first electronic device 2102, the second external electronic device 2104, or the server 2106). When the electronic device 2101 should perform a certain function or service automatically or in response to a request, the electronic device 2101 may request at least a portion of functions related to the function or service from the first electronic device 2102, the second external electronic device 2104, or the server 2106 instead of or in addition to performing the function or service for itself. The first electronic device 2102, the second external electronic device 2104, or the server 2106 may perform the requested function or additional function, and may transfer a result of the performance to the electronic device 2101. The electronic device 2101 may use a received result itself or additionally process the received result to provide the requested function or service. To this end, for example, a cloud computing technology, a distributed computing technology, or a client-server computing technology may be used.

Figure 22:
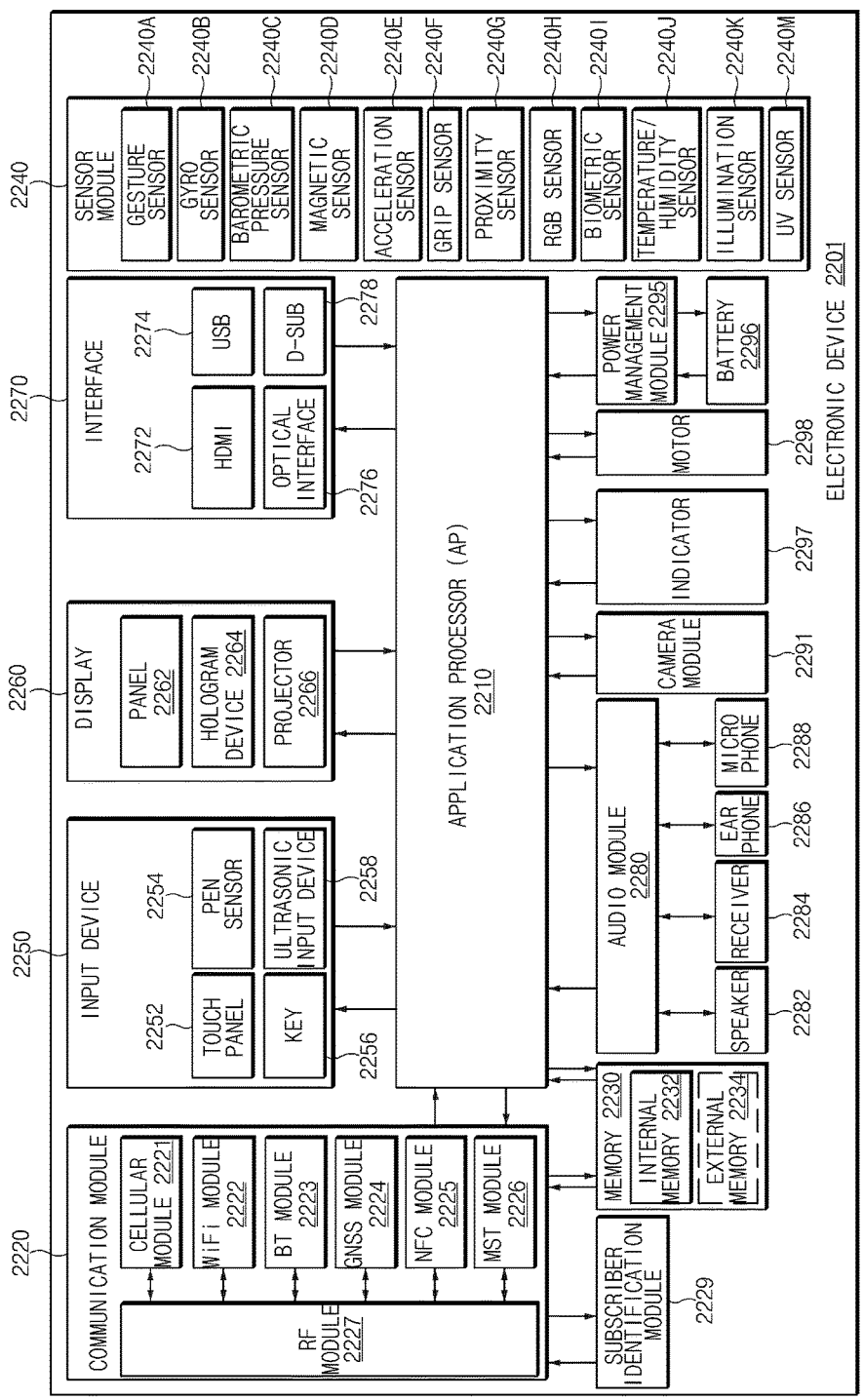
FIG. 22 is a block diagram of an electronic device, according to an embodiment of the present disclosure.

FIG. 22 is a block diagram of an electronic device, according to an embodiment of the present disclosure.

Referring to FIG. 22, an electronic device 2201 may include a part or the entirety of the electronic device 2101 illustrated in FIG. 21. The electronic device 2201 includes at least one processor (e.g., AP) 2210, a communication module 2220, a subscriber identification module (SIM) 2229, a memory 2230, a sensor module 2240, an input device 2250, a display 2260, an interface 2270, an audio module 2280, a camera module 2291, a power management module 2295, a battery 2296, an indicator 2297, and a motor 2298.

The processor 2210 may run an operating system or an application program so as to control a plurality of hardware or software elements connected to the processor 2210, and may process various data and perform operations. The processor 2210 may be implemented with, for example, a system on chip (SoC).

According to an embodiment of the present disclosure, the processor 2210 may further include a graphic processing unit (GPU) and/or an image signal processor. The processor 2210 may include at least a portion (e.g., a cellular module 2221) of the elements illustrated in FIG. 22. The processor 2210 may load, on a volatile memory, an instruction or data received from at least one of other elements (e.g., a nonvolatile memory) to process the instruction or data, and may store various data in a nonvolatile memory.

The communication module 2220 may have a configuration that is the same as or similar to that of the communication interface 2170 of FIG. 21. The communication module 2220 may include a cellular module 2221, a Wi-Fi module 2222, a Bluetooth (BT) module 2223, a GNSS module 2224 (e.g., a GPS module, a GLONASS module, a BeiDou module, or a Galileo module), a NFC module 2225, a MST module 2226, and a radio frequency (RF) module 2227.

The cellular module 2221 may provide a voice call service, a video call service, a text message service, or an Internet service through a communication network. The cellular module 2221 may identify and authenticate the electronic device 2201 in the communication network using the subscriber identification module 2229 (e.g., a SIM card). The cellular module 2221 may perform at least a part of functions that may be provided by the processor 2210. The cellular module 2221 may include a communication processor (CP).

Each of the Wi-Fi module 2222, the Bluetooth module 2223, the GNSS module 2224, the NFC module 2225, and the MST module 2226 may include a processor for processing data transmitted/received through the modules.

According to various embodiments of the present disclosure, at least a part of the cellular module 2221, the Wi-Fi module 2222, the Bluetooth module 2223, the GNSS module 2224, the NFC module 2225, and the MST module 2226 may be included in a single integrated chip (IC) or IC package.

The RF module 2227 may transmit/receive communication signals (e.g., RF signals). The RF module 2227 may include a transceiver, a power amp module (PAM), a frequency filter, a low noise amplifier (LNA), an antenna, etc.

According to another embodiment of the present disclosure, at least one of the cellular module 2221, the Wi-Fi module 2222, the Bluetooth module 2223, the GNSS module 2224, the NFC module 2225, or the MST module 2226 may transmit/receive RF signals through a separate RF module.

The SIM 2229 may include an embedded SIM and/or a card containing the subscriber identity module, and may include unique identification information (e.g., an integrated circuit card identifier (ICCID)) or subscriber information (e.g., international mobile subscriber identity (IMSI)).

The memory 2230 (e.g., the memory 2130) may include an internal memory 2232 or an external memory 2234. The internal memory 2232 may include at least one of a volatile memory (e.g., a dynamic RAM (DRAM), a static RAM (SRAM), a synchronous dynamic RAM (SDRAM), etc.), a nonvolatile memory (e.g., a one-time programmable ROM (OTPROM), a programmable ROM (PROM), an erasable and programmable ROM (EPROM), an electrically erasable and programmable ROM (EEPROM), a mask ROM, a flash ROM, a flash memory (e.g., a NAND flash memory, a NOR flash memory, etc.)), a hard drive, or a solid state drive (SSD).

The external memory 2234 may include a flash drive such as a compact flash (CF), a secure digital (SD), a Micro-SD, a Mini-SD, an extreme digital (xD), a multi-media card (MMC), a memory stick, etc. The external memory 2234 may be operatively and/or physically connected to the electronic device 2201 through various interfaces.

The sensor module 2240 may measure a physical quantity or detect an operation state of the electronic device 2201 so as to convert measured or detected information into an electrical signal. The sensor module 2240 may include at least one of a gesture sensor 2240A, a gyro sensor 2240B, a barometric pressure sensor 2240C, a magnetic sensor 2240D, an acceleration sensor 2240E, a grip sensor 2240F, a proximity sensor 2240G, a red/green/blue (RGB) sensor 2240H, a biometric sensor 2240I, a temperature/humidity sensor 2240J, an illumination sensor 2240K, or an ultraviolet (UV) sensor 2240M. Additionally or alternatively, the sensor module 2240 includes, for example, an olfactory sensor (E-nose sensor), an electromyography (EMG) sensor, an electroencephalogram (EEG) sensor, an electrocardiogram (ECG) sensor, an infrared (IR) sensor, an iris recognition sensor, and/or a fingerprint sensor. The sensor module 2240 may further include a control circuit for controlling at least one sensor included therein. In some various embodiments of the present disclosure, the electronic device 2201 may further include a processor configured to control the sensor module 2240 as a part of the processor 2210 or separately, so that the sensor module 2240 is controlled while the processor 2210 is in a sleep state.

The input device 2250 may include a touch panel 2252, a (digital) pen sensor 2254, a key 2256, or an ultrasonic input device 2258. The touch panel 2252 may employ at least one of capacitive, resistive, infrared, and ultraviolet sensing methods. The touch panel 2252 may further include a control circuit. The touch panel 2252 may further include a tactile layer so as to provide a haptic feedback to a user.

The (digital) pen sensor 2254 may include a sheet for recognition which is a part of a touch panel or is separate.

The key 2256 may include a physical button, an optical button, or a keypad.

The ultrasonic input device 2258 may sense ultrasonic waves generated by an input tool through a microphone 2288 so as to identify data corresponding to the ultrasonic waves sensed.

The display 2260 (e.g., the display 2160) may include a panel 2262, a hologram device 2264, or a projector 2266.

The panel 2262 may have a configuration that is the same as or similar to that of the display 2160 of FIG. 21. The panel 2262 may be flexible, transparent, or wearable. The panel 2262 and the touch panel 2252 may be integrated into a single module.

The hologram device 2264 may display a stereoscopic image in a space using a light interference phenomenon.

The projector 2266 may project light onto a screen so as to display an image. The screen may be disposed in the inside or the outside of the electronic device 2201.

According to an embodiment of the present disclosure, the display 2260 may further include a control circuit for controlling the panel 2262, the hologram device 2264, or the projector 2266.

The interface 2270 may include an HDMI 2272, a USB 2274, an optical interface 2276, or a D-subminiature (D-sub) 2278.

The interface 2270 may be included in the communication interface 2170 illustrated in FIG. 21. Additionally or alternatively, the interface 2270 may include a mobile high-definition link (MHL) interface, an SD card/multi-media card (MMC) interface, or an infrared data association (IrDA) interface.

The audio module 2280 may convert a sound into an electrical signal or vice versa. At least a portion of elements of the audio module 2280 may be included in the input/output interface 2150 illustrated in FIG. 21. The audio module 2280 may process sound information input or output through a speaker 2282, a receiver 2284, an earphone 2286, or the microphone 2288.

The camera module 2291 is a device for shooting a still image or a video.

According to an embodiment of the present disclosure, the camera module 2291 may include at least one image sensor (e.g., a front sensor or a rear sensor), a lens, an image signal processor (ISP), or a flash (e.g., an LED or a xenon lamp).

The power management module 2295 may manage power of the electronic device 2201. According to an embodiment of the present disclosure, the power management module 2295 may include a power management integrated circuit (PMIC), a charger integrated circuit (IC), or a battery gauge. The PMIC may employ a wired and/or wireless charging method. The wireless charging method may include, for example, a magnetic resonance method, a magnetic induction method, an electromagnetic method, etc. An additional circuit for wireless charging, such as a coil loop, a resonant circuit, a rectifier, etc., may be further included. The battery gauge may measure a remaining capacity of the battery 2296 and a voltage, current or temperature thereof while the battery is charged.

The battery 2296 may include a rechargeable battery and/or a solar battery.

The indicator 2297 may display a specific state of the electronic device 2201 or a part thereof (e.g., the processor 2210), such as a booting state, a message state, a charging state, etc.

The motor 2298 may convert an electrical signal into a mechanical vibration, and may generate a vibration or haptic effect.

A processing device (e.g., a GPU) for supporting a mobile TV may be included in the electronic device 2201. The processing device for supporting a mobile TV may process media data according to the standards of digital multimedia broadcasting (DMB), digital video broadcasting (DVB), MediaFLO™, etc.

Each of the elements described herein may be configured with one or more components, and the names of the elements may be changed according to the type of an electronic device. In various embodiments of the present disclosure, an electronic device may include at least one of the elements described herein, and some elements may be omitted or other additional elements may be added. Furthermore, some of the elements of the electronic device may be combined with each other so as to form one entity, so that the functions of the elements may be performed in the same manner as before the combination.

Figure 23:
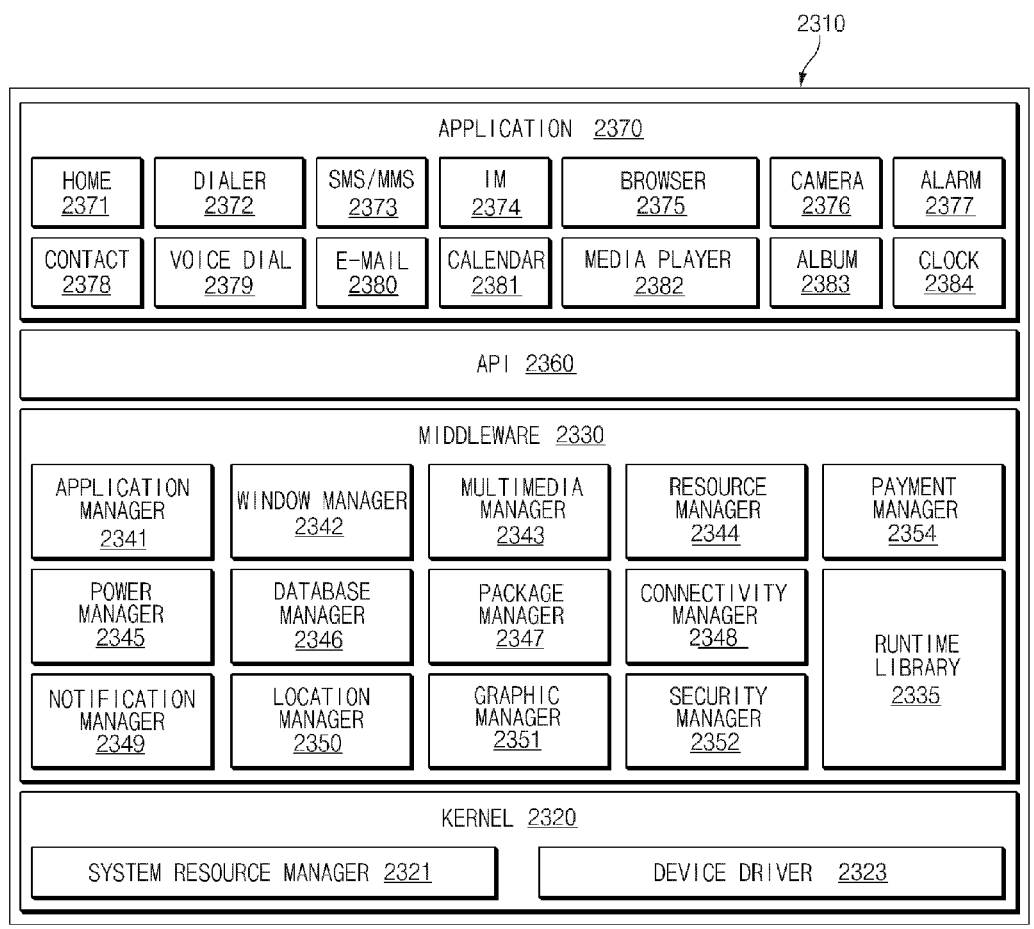
FIG. 23 is a block diagram of a program module, according to an embodiment of the present disclosure.

FIG. 23 is a block diagram of a program module, according to an embodiment of the present disclosure.

Referring to FIG. 23, a program module 2310 (e.g., the program 2140) may include an operating system (OS) for controlling a resource related to an electronic device (e.g., the electronic device 2101) and/or various applications (e.g., the application program 2147) running on the OS. The operating system may be, for example, Android, iOS, Windows, Symbian, Tizen, etc.

The program module 2310 includes a kernel 2320, a middleware 2330, an API 2360, and/or an application 2370. At least a part of the program module 2310 may be pre-loaded on an electronic device or may be downloaded from an external electronic device (e.g., the first electronic device 2102, the second external electronic device 2104, or the server 2106).

The kernel 2320 (e.g., the kernel 2141) may include a system resource manager 2321 or a device driver 2323.

The system resource manager 2321 may perform control, allocation, or retrieval of a system resource. According to an embodiment of the present disclosure, the system resource manager 2321 may include a process management unit, a memory management unit, a file system management unit, etc.

The device driver 2323 may include a display driver, a camera driver, a Bluetooth driver, a shared memory driver, a USB driver, a keypad driver, a Wi-Fi driver, an audio driver, or an inter-process communication (IPC) driver.

The middleware 2330 may provide a function that the applications 2370 require in common, or may provide various functions to the applications 2370 through the API 2360 so that the applications 2370 may efficiently use limited system resources in the electronic device. According to an embodiment of the present disclosure, the middleware 2330 (e.g., the middleware 2143) may include at least one of a runtime library 2335, an application manager 2341, a window manager 2342, a multimedia manager 2343, a resource manager 2344, a power manager 2345, a database manager 2346, a package manager 2347, a connectivity manager 2348, a notification manager 2349, a location manager 2350, a graphic manager 2351, and a security manager 2352.

The runtime library 2335 may include a library module that a complier uses to add a new function through a programming language while the application 2370 is running. The runtime library 2335 may perform a function for input/output management, memory management, or an arithmetic function.

The application manager 2341 may mange a life cycle of at least one of the applications 2370.

The window manager 2342 may manage a GUI resource used in a screen.

The multimedia manager 2343 may recognize a format required for playing various media files and may encode or decode a media file using a codec matched to the format.

The resource manager 2344 may manage a resource such as a source code, a memory, or a storage space of at least one of the applications 2370.

The power manager 2345 may operate together with a basic input/output system (BIOS) to manage a battery or power and may provide power information required for operating the electronic device.

The database manager 2346 may generate, search, or modify a database to be used in at least one of the applications 2370.

The package manager 2347 may manage installation or update of an application distributed in a package file format.

The connectivity manger 2348 may manage wireless connection of Wi-Fi, Bluetooth, etc.

The notification manager 2349 may display or notify of an event such as message arrival, appointments, and proximity alerts in such a manner as not to disturb a user.

The location manager 2350 may manage location information of the electronic device.

The graphic manager 2351 may manage a graphic effect to be provided to a user or a user interface related thereto.

The security manager 2352 may provide various security functions required for system security or user authentication. According to an embodiment of the present disclosure, in the case in which the electronic device 2101 includes a phone function, the middleware 2330 may further include a telephony manager for managing a voice or video call function of the electronic device.

The middleware 2330 may include a middleware module for forming a combination of various functions of the above-mentioned elements. The middleware 2330 may provide a module specialized for each type of an operating system to provide differentiated functions. Furthermore, the middleware 2330 may delete a part of existing elements or may add new elements dynamically.

The API 2360 (e.g., the API 2145) which is a set of API programming functions may be provided in different configurations according to an operating system. For example, in the case of Android or iOS, one API set may be provided for each platform, and, in the case of Tizen, at least two API sets may be provided for each platform.

The application 2370 (e.g., the application program 2147) may include at least one application capable of performing functions such as a home 2371, a dialer 2372, an SMS/MMS 2373, an instant message (IM) 2374, a browser 2375, a camera 2376, an alarm 2377, a contact 2378, a voice dial 2379, an e-mail 2380, a calendar 2381, a media player 2382, an album 2383, and a clock 2384. The application 2370 may additionally include a health care (e.g., to measure an exercise amount or blood sugar level) application, or environmental information (e.g., to provide air pressure, humidity, or temperature information) application.

According to an embodiment of the present disclosure, the application 2370 may include an information exchange application for supporting information exchange between the electronic device 2101 and the first electronic device 2102 or the second external electronic device 2104. The information exchange application may include a notification relay application for relaying specific information to the external electronic device or a device management application for managing the external electronic device.

For example, the notification relay application may have a function for relaying, to the first electronic device 2102 or the second external electronic device 2104, notification information generated in another application (e.g., an SMS/MMS application, an e-mail application, a health care application, an environmental information application, etc.) of the electronic device 2101. Furthermore, the notification relay application may receive notification information from the external electronic device and may provide the received notification information to the user.

The device management application may manage (e.g., install, delete, or update) at least one function (e.g., turn-on/turn off of the external electronic device itself (or some elements) or the brightness (or resolution) adjustment of a display) of the first electronic device 2102 or the second external electronic device 2104 communicating with the electronic device, an application running in the external electronic device, or a service (e.g., a call service, a message service, etc.) provided from the external electronic device.

According to an embodiment of the present disclosure, the application 2370 may include a specified application (e.g., a healthcare application of a mobile medical device) according to an attribute of the first electronic device 2102 or the second external electronic device 2104. The application 2370 may include an application received from the first electronic device 2102 or the second external electronic device 2104. The application 2370 may include a preloaded application or a third-party application downloadable from a server. The names of the elements of the program module 2310 illustrated may vary with the type of an operating system.

According to various embodiments of the present disclosure, at least a part of the program module 2310 may be implemented with software, firmware, hardware, or a combination thereof. At least a part of the program module 2310 may be implemented (e.g., executed) by a processor (e.g., the processor 2210). At least a part of the program module 2310 may include a module, a program, a routine, sets of instructions, or a process for performing at least one function.

The term "module" used herein may represent a unit including one of hardware, software and firmware or a combination thereof. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various embodiments of the present disclosure may be implemented as instructions stored in a computer-readable storage medium in the form of a program module. In the case where the instructions are performed by a processor (e.g., the processor 2120), the processor may perform functions corresponding to the instructions. The computer-readable storage medium may be the memory 2130.

A computer-readable recording medium may include a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, etc.). The program instructions may include machine language codes generated by compilers and high-level language codes that can be executed by computers using interpreters. The above-mentioned hardware device may be configured to be operated as one or more software modules for performing operations of various embodiments of the present disclosure and vice versa.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. An electronic device comprising:
   a display substrate including a screen area and a peripheral area in which a first conductive pattern is formed, the peripheral area surrounding at least a portion of the screen area;
   a connector on which a second conductive pattern is formed, the connector including a curved portion;
   a conductive bonding layer disposed between the peripheral area of the display substrate and the connector, and electrically connecting the first conductive pattern and the second conductive pattern; and
   a cutting part disposed through the display substrate, the conductive bonding layer, and the connector,
   wherein the cutting part includes a first portion surrounded by the peripheral area of the display substrate, and a second portion surrounded by the curved portion of the connector.

2. The electronic device of claim 1, wherein the conductive bonding layer comprises an anisotropic conductive film.

3. The electronic device of claim 1, wherein the connector comprises a flexible printed circuit board.

4. The electronic device of claim 1, wherein the cutting part further includes a first cutting part formed on one side of the display substrate and a second cutting part formed on one side of the connector, and wherein the connector further includes a dummy pattern.

5. The electronic device of claim 4, wherein the connector is bent to surround a periphery of one side of the display substrate, and at least a portion of the first cutting part and at least a portion of the second cutting part are aligned according to a cutting direction thereof.

6. The electronic device of claim 4, wherein the dummy pattern is separated from a periphery of the second cutting part by a spacing gap and has a width.

7. The electronic device of claim 4, wherein the connector comprises a first connector and a second connector, wherein the second connector has a property different from that of the first connector.

8. The electronic device of claim 7, wherein the first connector comprises a flexible printed circuit board, the second connector is connected to one side of the first connector, and the second connector and the display substrate are bonded to each other by the conductive bonding layer.

9. The electronic device of claim 8, wherein the second connector has an electrode part that has an electrode pattern and a non-electrode part that does not have an electrode pattern, and the second cutting part is formed in the non-electrode part of the second connector.

10. The electronic device of claim 9, wherein the dummy pattern is formed at an outer side of the second cutting part, and the dummy pattern extends along at least a portion of the second cutting part.

11. The electronic device of claim 10, wherein the dummy pattern is separated from a periphery of the second cutting part by a spacing gap and has a width.

12. An electronic device comprising:
a display substrate;
a connector connected to one side of the display substrate; and
an opening extending from a portion of the display substrate to a portion of the connector,
wherein the connector includes a dummy pattern extending along a periphery of the opening, and a via hole formed between the dummy pattern and the opening,
wherein at least a portion of the via hole is connected to the opening, and
wherein the connector is bent such that a portion of the opening formed in the connector and the display substrate is aligned with a remaining portion of the opening formed in the connector.

13. An electronic device comprising:
a housing comprising a first plate facing a first direction and a second plate facing a second direction opposite to the first direction;
a display disposed within the housing and exposed through the first plate; and
a component disposed adjacent to the display, when viewed from the top of the first plate,
wherein the display comprises:
  a display substrate having: a first surface disposed in parallel to the first plate and facing the first direction, a second surface facing the second direction, and a third surface facing a third direction that is substantially perpendicular to the first surface; and
  a connector having: a first part disposed on the first surface, a second part disposed on the second surface, and a third part extending from the first part to the second part and covering at least a portion of the third surface,
wherein a peripheral portion of the display substrate comprises a recess,
wherein portions of the first part, the second part, and the third part of the connector are cut along the recess of the display substrate, when viewed from above the first plate,
wherein the connector comprises:
  a first non-conductive layer facing the first direction;
  a second non-conductive layer facing the second direction; and
  a metal pad or pattern disposed along at least a portion of a periphery of the recess and inserted between the first non-conductive layer and the second non-conductive layer, in which the metal pad or pattern is electrically isolated, and
wherein at least a portion of the component is disposed in the recess, when viewed from above the first plate.

14. The electronic device of claim 13, wherein the surfaces of at least one of the first part and the second part of the connector, which are formed along the recess, comprise a plurality of channels or troughs.

15. The electronic device of claim 13, wherein a surface of the third part of the connector, which is formed along the recess, comprises a plurality of channels or troughs.

16. The electronic device of claim 13, wherein the display substrate comprises a glass plate, and a portion of a side surface of the glass plate is exposed to the recess.

17. The electronic device of claim 13, wherein the display comprises a screen area and a peripheral area surrounding the screen area, when viewed from above the first plate and the recess is formed in the peripheral area.

18. The electronic device of claim 17, wherein the screen area comprises:
a first side having a first length;
a second side extending from one end of the first side to be perpendicular to the first side and having a second length that is longer than the first length;
a third side extending from one end of the second side to be perpendicular to the second side and having the first length; and
a fourth side extending from one end of the third side to be perpendicular to the third side and having the second length, wherein the recess is formed adjacent to the first side.

19. The electronic device of claim 18, wherein the recess is formed adjacent to the second side or the fourth side.

* * * * *